(12) United States Patent
Takato et al.

(10) Patent No.: US 6,312,982 B1
(45) Date of Patent: Nov. 6, 2001

(54) METHOD OF FABRICATING A TRENCH CAPACITOR

(75) Inventors: Hiroshi Takato; Koichi Kokubun, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/351,182

(22) Filed: Jul. 12, 1999

(30) Foreign Application Priority Data

| Jul. 13, 1998 | (JP) | 10-197736 |
| Feb. 15, 1999 | (JP) | 11-035299 |
| Jul. 9, 1999 | (JP) | 11-195671 |

(51) Int. Cl.$^7$ ............................................. H01L 21/8242
(52) U.S. Cl. ........................... 438/238; 438/243; 438/246
(58) Field of Search .................................. 438/238–256, 438/381–399

(56) References Cited

U.S. PATENT DOCUMENTS

| 5,200,354 | * | 4/1993 | Om et al. |  |
| 6,043,537 | * | 3/2000 | Jun et al. | 257/350 |
| 6,127,231 | * | 10/2000 | Mori | 438/275 |

FOREIGN PATENT DOCUMENTS

| 1-264257 | 10/1989 | (JP) . |
| 09-116113 | 5/1997 | (JP) . |
| 10-223849 | 8/1998 | (JP) . |
| 10-256511 | 9/1998 | (JP) . |
| 11-251527 | 9/1999 | (JP) . |

* cited by examiner

*Primary Examiner*—Jey Tsai
(74) *Attorney, Agent, or Firm*—Pillsbury Winthrop LLP

(57) ABSTRACT

This invention provides a semiconductor device by which a high-speed DRAM cell and logic circuit can be obtained without increasing the number of fabrication steps, and a method of fabricating the same. A memory cell is constructed of capacitors formed in two end portions of an element formation region of a silicon substrate and a MOS transistor formed between these capacitors. The interval between gate electrodes of MOS transistors in adjacent memory cells is made larger than the intervals between these gate electrodes and gate electrodes formed outside the former gate electrodes. A portion above an n-type diffusion layer connected to a capacitor node is filled with a spacer insulating film, and an n-type diffusion layer connected to a bit line is covered with the spacer insulating film. A titanium silicide film is formed on one of these n-type diffusion layers and the gate electrodes. In a first transistor in a memory cell array, a metal silicide film is not formed on the surfaces of source and drain diffusion layers and is formed only on the surface of a gate electrode. In a second transistor in a logic circuit, a metal silicide film is formed on the surfaces of source and drain diffusion layers and a gate electrode.

10 Claims, 21 Drawing Sheets

[ DRAM CELL ARRAY ]

METHOD OF FABRICATING A TRENCH CAPACITOR

BACKGROUND OF THE INVENTION

The present invention relates to a semiconductor device and a method of fabricating the same and, more particularly, to a memory cell transistor structure suitable for a logic/DRAM hybrid device and a method of fabricating the same.

Recently, to realize high-speed, large-amount data transfer with respect to memories, a technique capable of forming both a logic circuit and a DRAM on one chip is being required. In a logic circuit device, a technique which reduces the resistance by adhering metal silicide to a gate electrode and source and drain diffusion layers of a MOS transistor is conventionally used to improve the circuit performance. Accordingly, it is desirable to apply a similar resistance reducing technique to a DRAM cell in a logic/DRAM hybrid device.

In a DRAM cell, however, it is presumably better not to adhere metal silicide to source and drain regions in order to suppress a leakage current in a junction connecting to a memory capacitor and thereby improve the charge holding characteristic (e.g., "Trade-offs in the Integration of High Performance Devices with Trench Capacitor DRAM", S. Crowder et al., pp. 45–48, IEDM971). One reason is that when a metal silicide film is formed on the surfaces of source and drain regions, this metal silicide may penetrate through diffusion layers to cause junction leakage. Also, forming a metal silicide film requires the formation of a heavily doped impurity diffusion layer having a dose of about $1E15/cm^2$ or more in source and drain regions. When such a heavily doped impurity diffusion layer is formed, junction leakage increases due to this heavily doped impurity diffusion layer.

In the fabrication of a logic/DRAM hybrid device, it is important to reduce the number of fabrication steps. Therefore, it is required to develop a logic/DRAM hybrid device fabrication technique which simplifies the fabrication process, reduces the resistance of source and drain diffusion layers and a gate electrode, and retains the charge holding characteristic of a memory capacitor.

If regions are separated in one chip such that metal silicide is adhered in a logic circuit and is not adhered in a DRAM cell array, it is necessary to add a mask step and an accompanying processing step. This increases the number of fabrication steps.

SUMMARY OF THE INVENTION

The present invention has been made in consideration of the above situation, and has as its object to provide a semiconductor device which neither deteriorates the signal holding characteristic of an impurity diffusion layer serving as a signal storage node nor increases the number of fabrication steps, and a method of fabricating the same.

The present invention is a semiconductor device comprising a first MOS transistor having a gate electrode, and first and second impurity diffusion layers aligned with said gate electrode, in which a signal storage node capable of floating is connected to said first impurity diffusion layer, and a metal silicide film is formed on a surface of said second impurity diffusion layer, and a second MOS transistor having a gate electrode, and first and second impurity diffusion layers aligned with said gate electrode, in which a metal silicide film is formed on surfaces of both said first and second impurity diffusion layer.

The present invention is a semiconductor device comprising a semiconductor substrate and memory cells arrayed on a semiconductor substrate, said memory cells having a capacitor, and a MOS transistor having a gate electrode connected to a word line, and first and second impurity diffusion layers aligned with said gate electrode, in which said capacitor is connected to said first impurity diffusion layer, and a metal silicide film is formed on a surface of said second impurity diffusion layer.

A metal silicide film is desirably formed on the gate electrode of the MOS transistor.

The metal silicide film formed on the surface of the second impurity diffusion layer of the MOS transistor is desirably self-aligned with a region of the second impurity diffusion layer regardless of a size and position of a contact portion of the bit line.

More specifically, the device further comprises a first spacer insulating film formed on a side wall of said gate electrode on a side of said first impurity diffusion layer, in which said first spacer insulating film connects to a spacer insulating film of an adjacent gate electrode on the side of said first impurity diffusion layer so as to cover consecutively said first impurity diffusion layer, and a second spacer insulating film formed on a side wall of said gate electrode on a side of said second impurity diffusion layer, in which said second spacer insulating film is separated by a predetermined interval from a spacer insulating film of an adjacent gate electrode on the side of said second impurity diffusion layer so as to make said metal silicide film formed on the surface of said second impurity diffusion layer in a state of being aligned with the predetermined interval.

A logic circuit having a plurality of MOS transistors is desirably integrated on the semiconductor substrate, and a metal silicide film is desirably formed by self-alignment on surfaces of source and drain diffusion layers and gate electrode of each MOS transistor constructing the logic circuit.

A method of fabricating a semiconductor device according to the present invention comprises the steps of forming a capacitor on a semiconductor substrate, forming a MOS transistor having a gate electrode serving as a word line and first and second impurity diffusion layers aligned with the gate electrode, the first impurity diffusion layer being connected to one node of the capacitor, forming a metal silicide film on a surface of the second impurity diffusion layer of the MOS transistor, and forming a bit line connected to the second impurity diffusion layer of the MOS transistor via the metal silicide film.

The metal silicide film is desirably self-aligned with a region of the second impurity diffusion layer and the gate electrode of the MOS transistor.

The method further comprises, before the step of forming the metal silicide film, the step of forming first and second spacer insulating films on side walls of the gate electrode of the MOS transistor on the sides of the first and second impurity diffusion layers, respectively, such that the first spacer insulating film connects to a spacer insulating film of an adjacent gate electrode on the side of the first impurity diffusion layer to cover the first impurity diffusion layer, and the second spacer insulating film on the side of the second impurity diffusion layer is separated by a predetermined interval from a spacer insulating film of an adjacent gate electrode on the side of the second impurity diffusion layer to thereby expose the second impurity diffusion layer.

In the present invention, of the first and second impurity diffusion layers of the MOS transistor, a metal silicide film is not formed on the first impurity diffusion layer connected to the signal storage node and is formed only on the second impurity diffusion layer. Accordingly, it is possible to well maintain the signal holding characteristic of the signal storage node and reduce the resistance of the impurity diffusion layer.

Especially when the present invention is applied to a DRAM, it is possible to prevent deterioration of the charge holding characteristic caused by junction leakage on the side of a capacitor of a DRAM memory cell and reduce the resistance of an impurity diffusion layer on the side of a bit line contact.

In the present invention, a metal silicide film can be formed only on the second impurity diffusion layer of the first and second impurity diffusion layers of the MOS transistor without using any special mask step. This is accomplished by optimally designing the pattern and size of gate electrodes serving as word lines and forming a portion in which a spacer insulating film formed on the side walls of the gate electrodes completely fills the interval between the gate electrodes and a portion in which this interval is not filled.

In the present invention, a metal silicide film can be formed only on a necessary impurity diffusion layer and gate electrode by the use of selective growth of the metal silicide film.

Especially when the present invention is applied to a logic/DRAM hybrid device, the characteristics of both the logic circuit and the DRAM can be improved without increasing the number of fabrication steps.

A semiconductor device of the present invention comprises a memory cell array having a memory cell and a first transistor for transferring information, and a logic circuit having a second transistor, wherein a metal silicide film is not formed on surfaces of source and drain diffusion layers and is formed only on a surface of a gate electrode of the first transistor, and a metal silicide film is formed on surfaces of source and drain diffusion layers and gate electrode of the second transistor.

A semiconductor device of the present invention comprises a memory cell array having a first transistor in which a metal silicide film is not formed on surfaces of source and drain diffusion layers and is formed only on a surface of a gate electrode, and a trench capacitor whose capacitor node is electrically connected to one of the source and drain diffusion layers, and a logic circuit having a second transistor in which a metal silicide film is formed on surfaces of source and drain diffusion layers and a gate electrode, wherein first and second side-wall insulating films are formed on side walls of the gate electrode of the first transistor, the first side-wall insulating film connects to a side-wall insulating film of an adjacent gate electrode on the side of one of the source and drain diffusion layers to thereby cover one of the source and drain diffusion layers, and the second side-wall insulating film on the side of the other one of the source and drain diffusion layers is separated by a predetermined interval from a side-wall insulating film of an adjacent gate electrode on the side of the other one of the source and drain diffusion layers.

In the semiconductor device of the present invention, the metal silicide film is desirably a cobalt silicide film.

A method of fabricating a semiconductor device of the present invention comprises the steps of forming a capacitor constructing a memory cell in a memory cell array region of a semiconductor substrate, forming a first transistor in the memory cell array region of the semiconductor substrate, the first transistor comprising a gate electrode which is continuously formed to serve as a word line and source and drain diffusion layers one of which is connected to the capacitor and the other one of which serves as a bit line contact layer, and simultaneously forming a second transistor in a logic circuit region, forming a mask material which is self-aligned with the gate electrode of the first transistor in the memory cell array region to cover the source and drain diffusion layers on the two sides of the gate electrode and expose a surface of the gate electrode of the first transistor and surfaces of source and drain diffusion layers and gate electrode of the second transistor in the logic circuit region, and forming a metal silicide film by self-alignment on the surface of the gate electrode of the first transistor and on the surfaces of the source and drain region and the gate electrode of the second transistor.

A method of fabricating a semiconductor device of the present invention comprises the steps of forming a capacitor constructing a memory cell in a memory cell array region of a semiconductor substrate, forming a first transistor in the memory cell array region of the semiconductor substrate, the first transistor comprising a gate electrode which is continuously formed to serve as a word line and source and drain diffusion layers one of which is connected to the capacitor and the other one of which serves as a bit line contact layer, and the gate electrodes being arranged at nonuniform pitches such that a space between a certain gate electrode and an adjacent gate electrode on the side of the capacitor is smaller than a space between the certain gate electrode and an adjacent gate electrode on the side of the bit line contact, and simultaneously forming a second transistor in a logic circuit region, forming a side wall insulating film on side surfaces of the gate electrodes of the first and second transistors so as to fill the narrower space of the spaces between the gate electrodes in the memory cell array region, forming a heavily doped impurity diffusion layer self-aligned with the gate electrodes and the side-wall insulating film on the source and drain diffusion layers of the first and second transistors, sequentially depositing a first insulating film of the same kind as the side-wall insulating film and a second insulating film of a different kind from the side-wall insulating film on the semiconductor substrate, etching the second insulating film to leave only the wider space of the spaces between the gate electrodes in the memory cell array region, etching away the first insulating film by using the second insulating film as a mask to expose a surface of the gate electrode of the first transistor in the memory cell array region and surfaces of the source and drain diffusion layers and gate electrode of the second transistor in the logic circuit region, and forming a metal silicide film by self-alignment on the surface of the gate electrode of the first transistor and on the surfaces of the source and drain diffusion layers and gate electrode on the second transistor.

DESCRIPTION OF THE PREFERRED EMBODIMENTS

Embodiments of the present invention will be described below with reference to the accompanying drawings.

Figure 1:
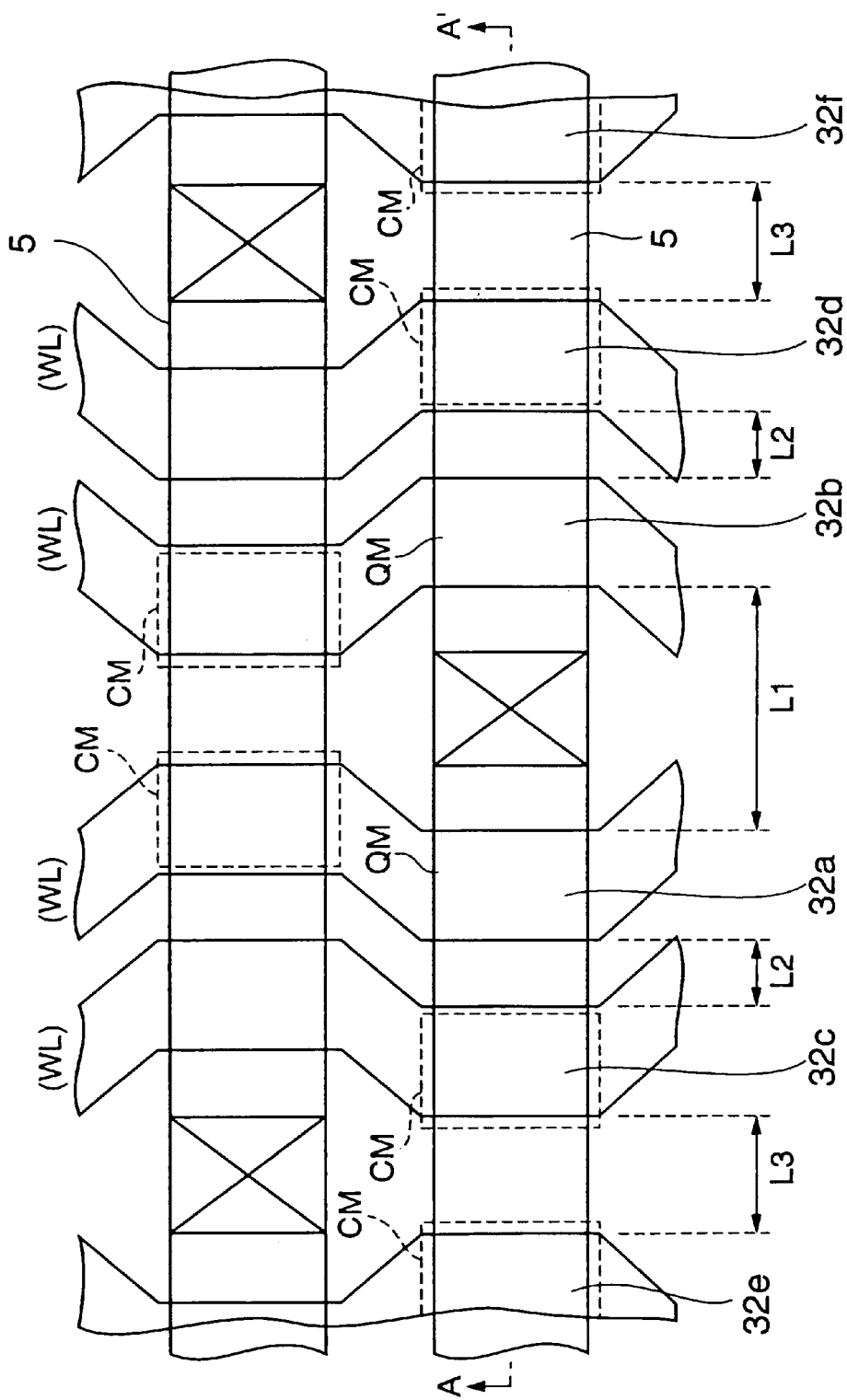
FIG. 1 is a plan view of a DRAM cell array of a logic/DRAM hybrid device according to an embodiment of the present invention.
Figure 2:
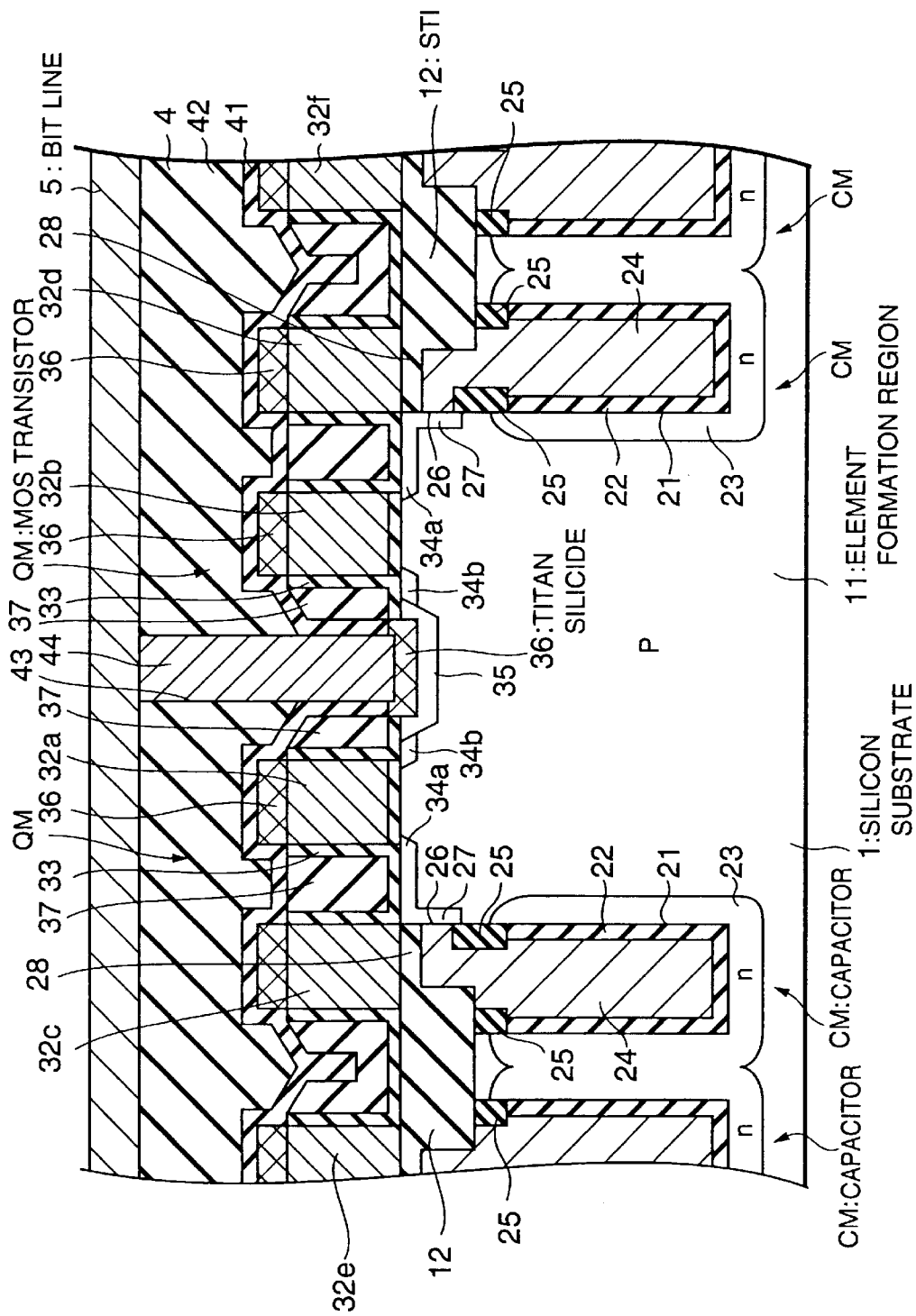
FIG. 2 is a sectional view taken along a line A-A' in FIG. 1.

FIG. 1 is a plan view showing a DRAM cell array according to the first embodiment in which the present invention is applied to a logic/DRAM hybrid device. FIG. 2 is a longitudinal sectional view taken along a line A-A' in FIG. 1.

In this DRAM cell array, long and narrow rectangular element formation regions 11 defined by an element isolation insulating film 12 are formed on a silicon substrate 1. This element isolation insulating film 12 is formed by a buried insulating film obtained by, e.g., STI (Shallow Trench Insulation). In each element formation region 11, two memory cells including MOS transistors QM and capacitors CM are formed. The capacitors CM are formed on the two sides of the element formation region 11.

The capacitors CM in this embodiment are trench capacitors. That is, as shown in FIG. 2, each capacitor CM has a trench 21 formed in the substrate 1, an n-type layer 23 formed by diffusion from the side walls of the trench 21 into the substrate 1 and serving as a plate electrode, a capacitor insulating film 22 formed on the trench side walls, and a capacitor node 24 buried in the trench.

The capacitor node 24 is n-type impurity-doped polysilicon. The upper surface of this capacitor node 24 is covered with an insulating film 28. A collar 25 is formed in the upper portion of the trench 21. An opening 26 is formed in a portion of this collar 25. An n-type layer 27 formed by diffusion from this opening 26 into the substrate 1 connects with a diffusion layer 34a of the MOS transistor QM to be formed later.

In one element formation region 11 sandwiched by the capacitors CM, the two MOS transistors QM are formed. Each MOS transistor QM has gate electrodes 32 (32a, 32b, 32c, 32d, ... ) formed on the silicon substrate 1 via a gate insulating film 31 and first and second n-type diffusion layers 34a and 34b self-aligned with the gate electrodes 32. The first diffusion layer 34a is, e.g., a source region and connected to the capacitor node 24 via the n-type diffusion layer 27. The second diffusion layer 34b is a drain region and connected to a bit line 5. As shown in FIG. 1, each gate electrode 32 is continuously formed in one direction to serve as a word line WL.

In this embodiment, of the first and second diffusion layers 34a and 34b of the MOS transistor QM constructing the memory cell, a heavily doped $n^+$-layer 35 is formed only on the second diffusion layer 34b. A titanium silicide film 36 is formed on the surface of this $n^+$-type layer 35. No titanium silicide film is formed on the first diffusion layer 34a connected to the capacitor node 24. The titanium silicide film 36 is also formed on each gate electrode 32.

In this embodiment, of the first and second diffusion layers 34a and 34b of the MOS transistor QM, the titanium silicide film 36 is formed only on the second diffusion layer 34b without using any special mask step. This is accomplished by a self-alignment step which improves the layout of the gate electrodes 32. This step will be described in detail below.

As shown in FIG. 2, let L1 shown in FIG. 1 be the distance between the first gate electrode 32a and second gate electrode 32b forming the MOS transistors QM of two adjacent memory cells formed in the element formation region. Also, let L2 be the distances from the third gate electrode 32c and fourth gate electrode 32d, formed outside the first and second gate electrodes 32a and 32b as word lines passing over the regions of the capacitors CM, to the first and second gate electrodes 32a and 32b, respectively. In this embodiment L1>L2 as shown in FIG. 1.

By using this gate electrode layout, a spacer insulating film 37 is formed by a silicon nitride film on the side surfaces of the gate electrodes 32. As shown in FIG. 2, this spacer insulating film 37 continuously covers the first diffusion layer 34a between the first and second gate electrodes 32a and 32b and between the third and fourth gate electrodes 32c and 32d. Between the first and second gate electrodes 32a and 32b, the spacer insulating film 37 is separated to expose the second n-type diffusion layer 34b. More specifically, this state is obtained by setting the distance L1 to be twice or more the film thickness of the spacer insulating film 37 and the distance L2 be twice or less the film thickness of the spacer insulating film 37.

When an n-type impurity is doped while the spacer insulating film 37 is thus formed, the n⁺-type layer 35 is formed only on the second n-type diffusion layer 34b between the first and second gate electrodes 32a and 32b. Additionally, titanium silicide is selectively grown. Consequently, as shown in FIG. 2, the self-aligned titanium silicide film 36 is formed in the region of the second diffusion layer 34b and the regions of the gate electrodes 32.

After the MOS transistors QM are formed, an insulating interlayer 4 is deposited. In this embodiment, this insulating interlayer 4 is a stacked film of a silicon nitride film 41 and a silicon oxide film (BPSG film) 42. A bit line contact hole 43 is formed in this insulating interlayer 4, and a contact tungsten layer 44 is buried flat in this hole 43. After that, the bit line 5 is formed on the insulating interlayer 4.

The relationship between the first and second gate electrodes 32a and 32b in one element isolation region 11 and the third and fourth gate electrodes 32c and 32d formed outside the first and second gate electrodes 32a and 32b has been explained so far. In this embodiment, a distance L3 from gate electrodes 32e and 32f, formed outside the third and fourth gate electrodes 32c and 32d, i.e., arranged in adjacent element formation regions along the bit line direction, to the third and fourth gate electrodes 32c and 32d is set to L2<L3<L1. The spacer insulating film 37 is also buried in portions between these gate electrodes 32e and 32f and the third and fourth gate electrodes 32c and 32d. In this embodiment, the distance L3 is slightly larger than the double of the film thickness of the spacer insulating film 37. However, the element isolation insulating film 12 is not exposed by improving the etching step of forming the spacer insulating film.

In this embodiment as described above, the titanium silicide film 36 is formed only on the second n-type diffusion layer 34b connected to the bit line 5 of the MOS transistors QM constructing two adjacent memory cells in one element formation region. This titanium silicide film 36 is self-aligned with the second n-type diffusion layer 34b and the gate electrodes 32 and hence can be formed regardless of the size and position of the bit line contact hole 43.

In this embodiment, the titanium silicide film 36 is formed on the upper surface of the diffusion layer 35 because the relation L2<L1 holds. So, the contact resistance can be reduced. Additionally, no titanium silicide film is formed on the diffusion layer 34a. Therefore, it is possible to prevent the electric charge stored in the capacitor node 24 from leaking to the silicon substrate 1 through the diffusion layer 34a.

The distance L3 is substantially determined by the interval between capacitors of adjacent memory cells. The relation L3<L1 is required to leave the spacer insulating film 37 between the gate electrodes 32c and 32e and between the gate electrodes 32b and 32d and prevent the exposure of the element isolation insulating film 12, thereby preventing the element isolation insulating film 12 from being etched in the subsequent step. To meet this requirement, L3 is preferably as small as possible. However, if L3 is extremely small, this L3 causes a gate electrode short circuit in the element isolation region. Hence, L3 is desirably larger than L2.

Also, the gate electrodes 32 are so formed as to meet the relation L2<L1 in order to form the titanium silicide film 36 on the gate electrodes (word lines) 32 on the diffusion layer 35 and not to form any titanium silicide film on the diffusion layer 34a. Accordingly, the number of fabrication steps does not increase.

The side surfaces of the gate electrodes 32 are covered with the insulating films 33 and 37, and the upper and side surfaces of the titanium silicide film 36 are covered with the insulating film 41. Therefore, the tungsten layer 41 can be formed by self-alignment.

Furthermore, the relation L2<L1 need only be satisfied in this embodiment. So, it is possible by decreasing L2 to shorten the distance between the gate electrode 32a and the capacitor node 24, i.e., the length of the diffusion layer 34a and thereby reduce the resistance.

Figure 3:
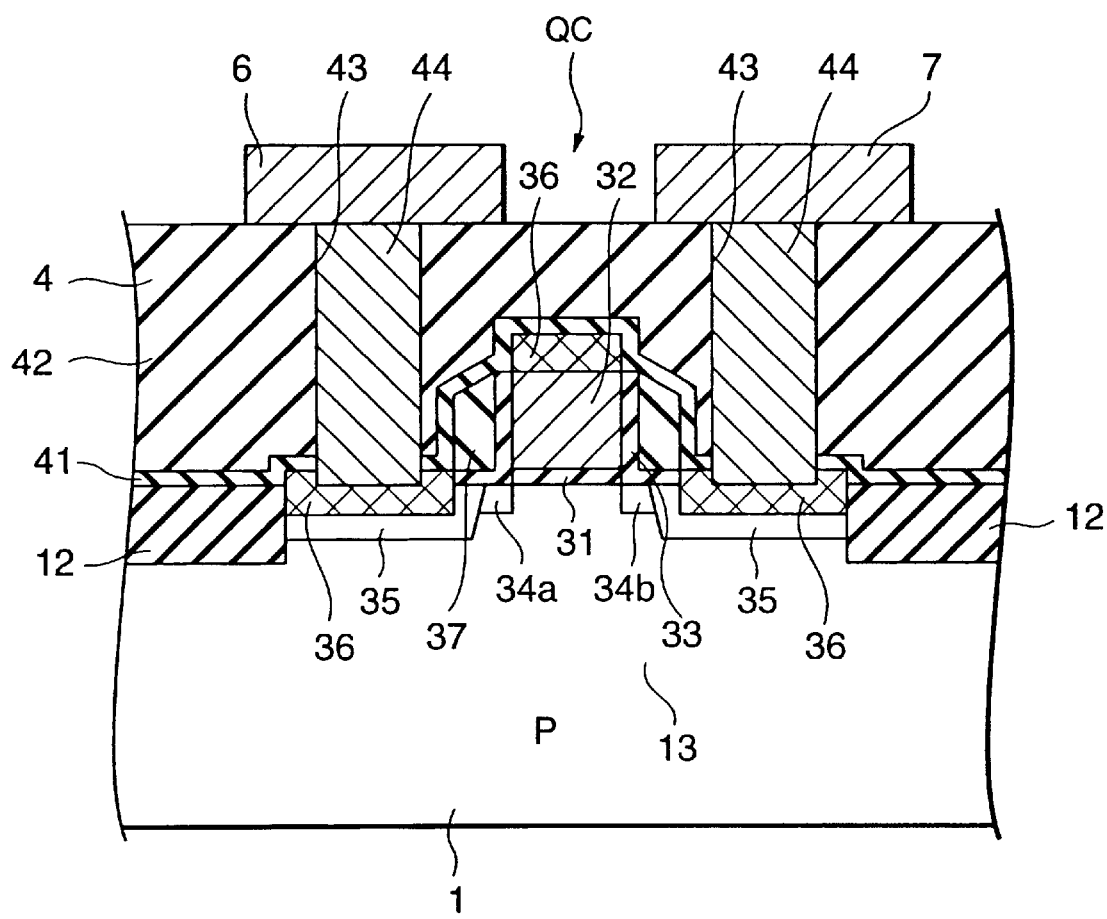
FIG. 3 is a sectional view showing the MOS transistor structure of a logic circuit of this embodiment.

In this embodiment, the structure of one MOS transistor QM of a logic circuit formed together with a DRAM is as shown in FIG. 3. The same reference numerals as in the memory cells shown in FIG. 2 denote parts formed in the same steps in FIG. 3, showing the correspondence between them. This MOS transistor QC is formed in an element formation region 13 surrounded by an element isolation insulating film 12 of a silicon substrate 1. An n⁺-type diffusion layer 35 is formed on source and drain diffusion layers 34a and 34b of the MOS transistor QC. A titanium silicide film 36 is formed on the surface of this n⁺-type diffusion layer 35. The titanium silicide film 36 is also formed on a gate electrode 32. The source and drain diffusion layers 34a and 34b are connected to signal lines 6 and 7, respectively, via a tungsten layer 44 buried in an insulating interlayer 4. These signal lines 6 and 7 are formed by patterning the same conductor interconnecting film as a bit line 5. That is, this logic circuit has no problem of charge leakage occurring in the memory cell. So, the resistance can be reduced by forming the titanium silicide film 36 on the gate electrode 32 and the diffusion layer 35.

Figure 4:
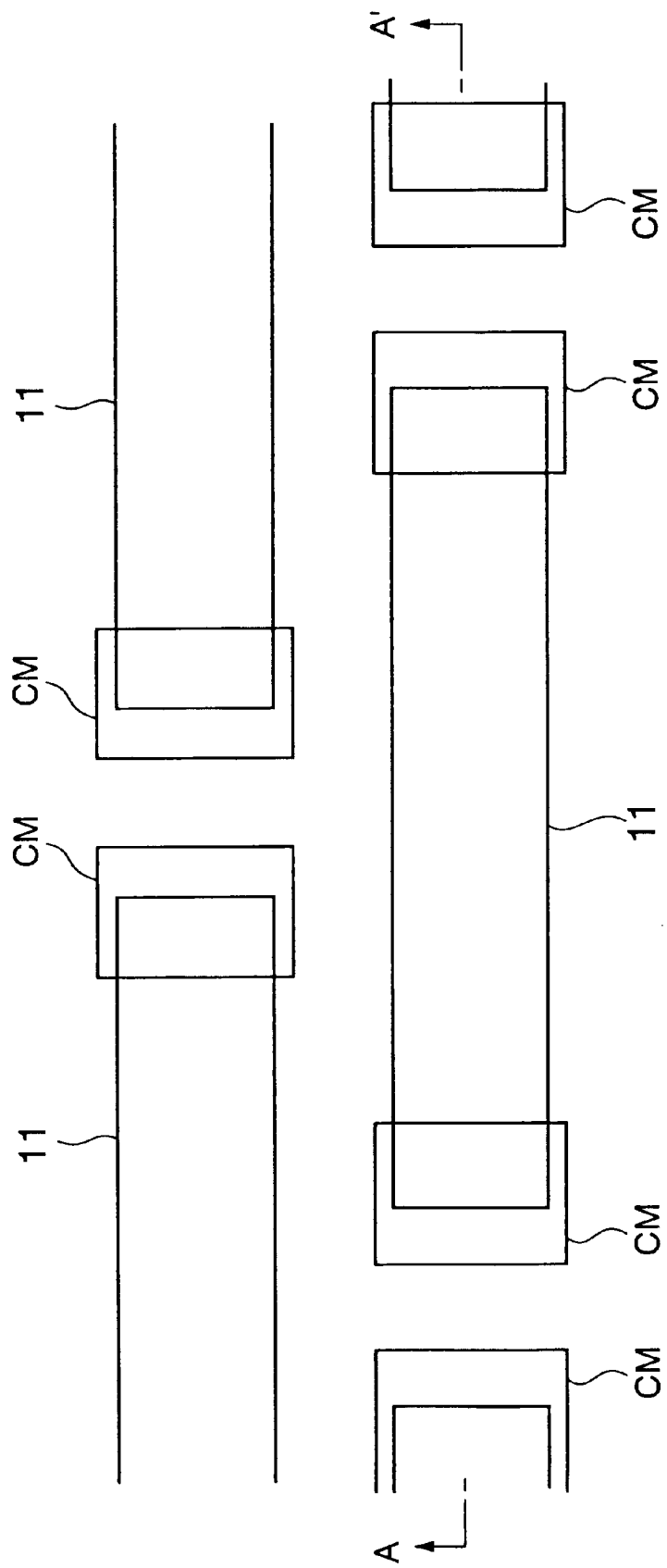
FIG. 4 is a plan view showing a capacitor formation step and an element isolation step of the DRAM cell array of this embodiment.
Figure 5:
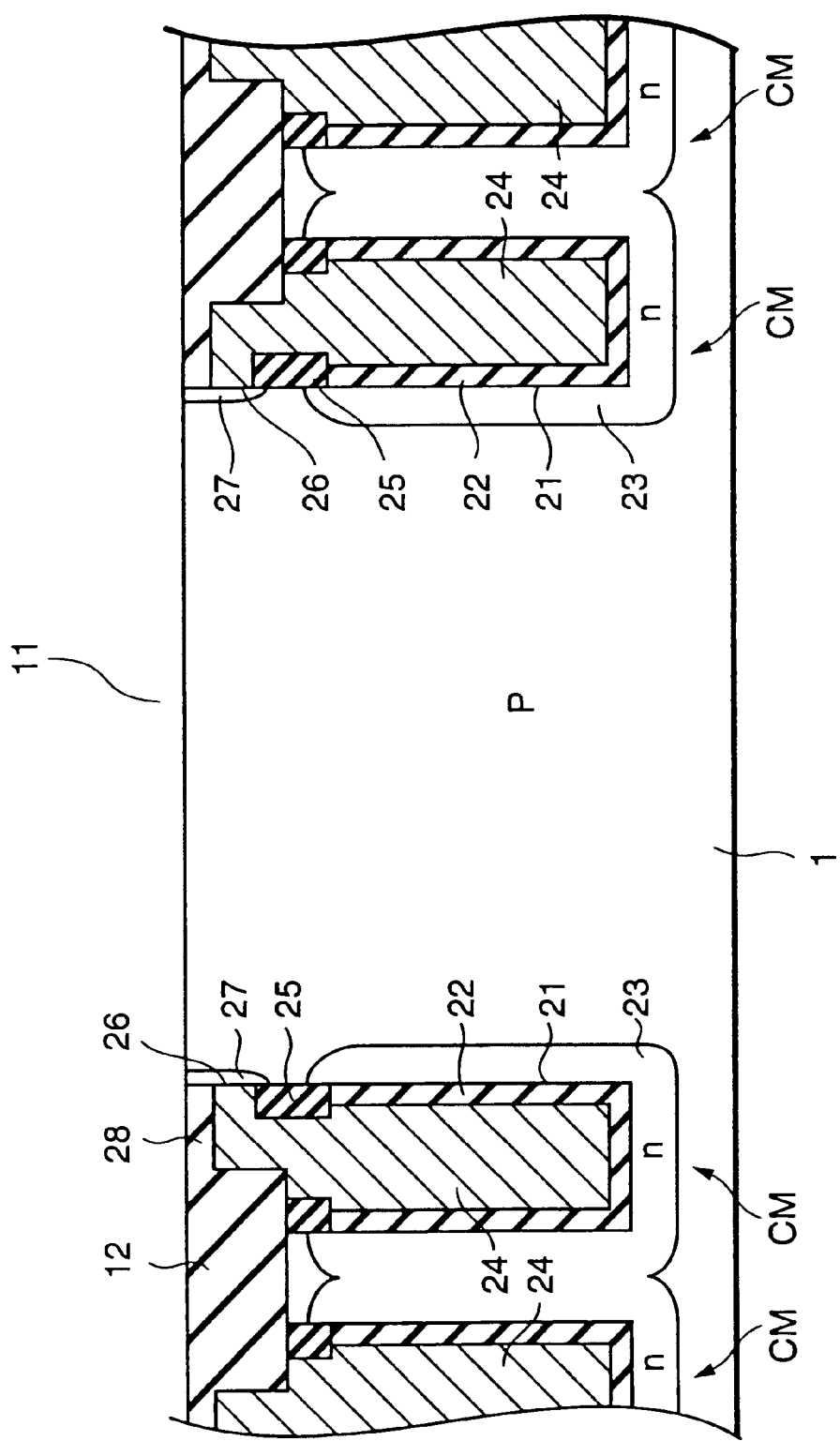
FIG. 5 is a sectional view taken along a line A-A' in FIG. 4.

Practical fabrication steps of the DRAM cell array of this embodiment will be described below. FIG. 4 is a plan view showing the state in which element isolation is performed by forming the trench capacitors CM in the silicon substrate 1. FIG. 5 is a sectional view taken along a line A-A' in FIG. 4. Steps up to this state are generally known, so these steps will be briefly described below.

The trenches 21 are formed in the silicon substrate 1, and the n-type layer 23 is formed by using solid phase diffusion or the like. The capacitor insulating film 22 is formed on the trench side walls, and the capacitor nodes 24 are buried in the trenches. In an actual case, the capacitor nodes 24 are buried by a plurality of steps. The collars 25 are formed in the upper portions of the trenches 21. The openings 26 are formed in portions of these collars 25 to diffuse an impurity outward from the capacitor nodes 24, thereby forming the n-type layers 27.

After the capacitors CM are formed, the element isolation insulating film 12 is buried by using the STI technique. Consequently, as shown in FIG. 4, the long and narrow element formation regions 11 are defined such that the capacitors CM are formed on the two ends of each element formation region 11.

Figure 6:
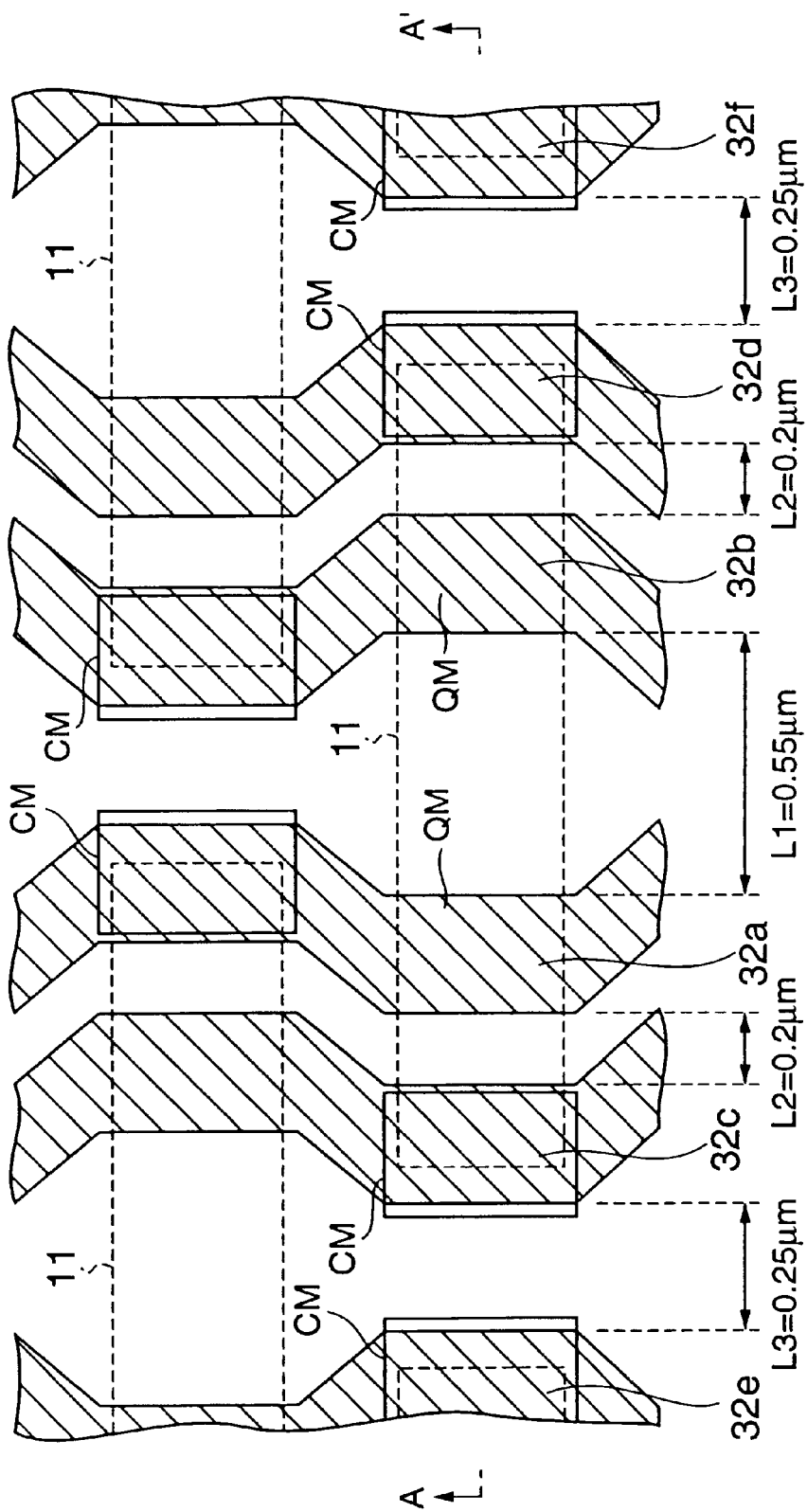
FIG. 6 is a plan view showing a MOS transistor formation step of the DRAM cell array of this embodiment.
Figure 7:
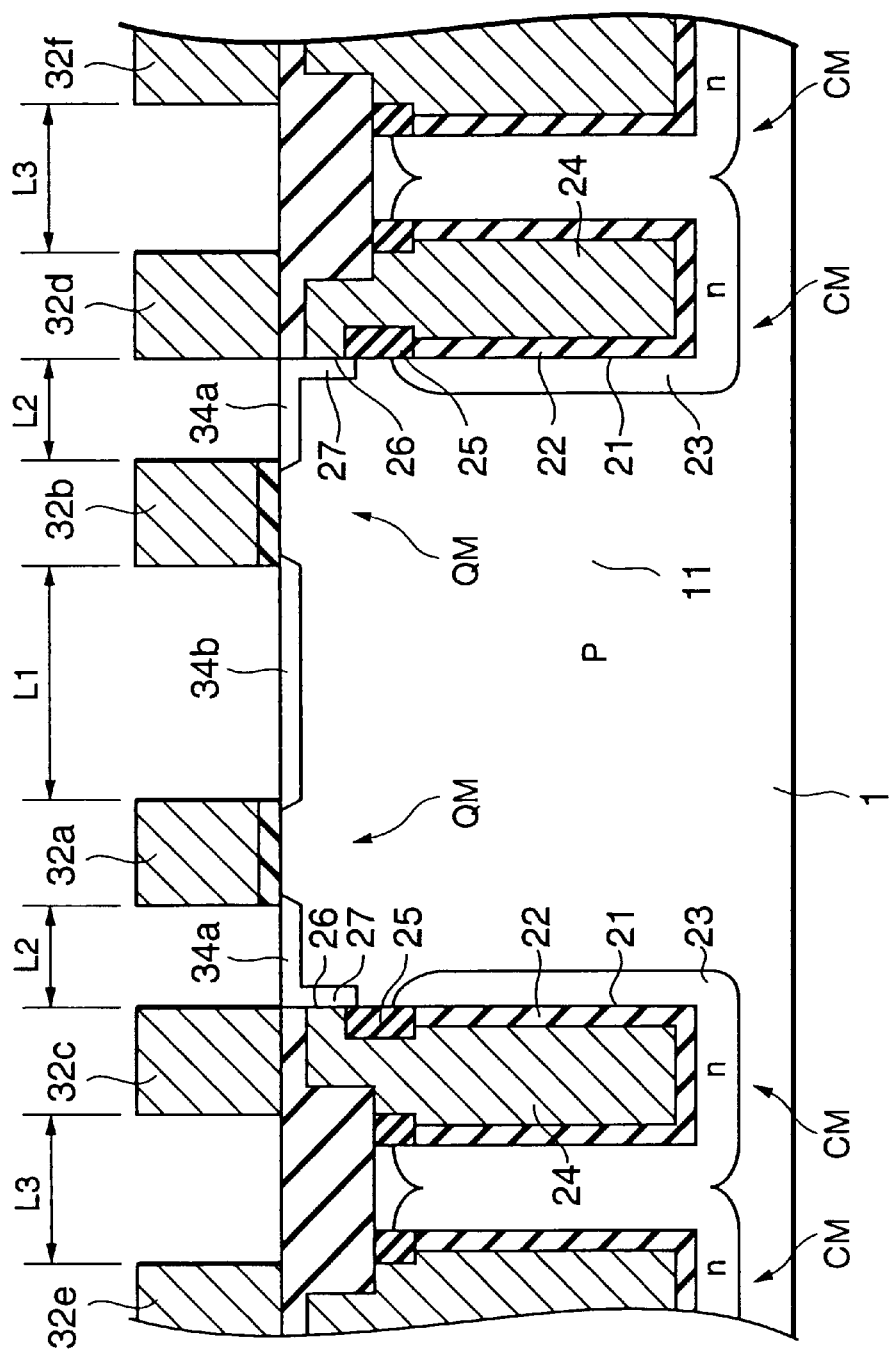
FIG. 7 is a sectional view taken along a line A-A' in FIG. 6.

FIG. 6 is a plan view showing a MOS transistor QM formation step. FIG. 7 is a sectional view taken along a line A-A' in FIG. 6. As shown in FIGS. 6 and 7, the gate insulating film 31 is formed in the element formation region 11, and the gate electrodes 32 are formed by patterning. Subsequently, those gate electrodes 32 are used as masks to ion-implant P (phosphorus), thereby forming the first and second n-type diffusion layers 34a and 34b. The gate electrodes 32 are made of, e.g., a 250-nm thick polysilicon film. As shown in FIG. 6, each gate electrode 32 is continuously formed by patterning to serve as the word line WL. The effective gate electrode width on the element formation region 11 is, e.g., 0.25 μm.

The gate electrodes 32 form bent patterns bypassing bit line contacts in one element formation region 11. That is, the distance between the first and second gate electrodes 32a and 32b of adjacent memory cells in one element formation region 11 is L1=0.55 μm. The distances from these first and second gate electrodes 32a and 32b to the third and fourth gate electrodes 32c and 32d formed outside the first and second gate electrodes 32a and 32b are L2=0.2 μm. Also, the distances from the third and fourth gate electrodes 32c and 32d to the gate electrodes 32e and 32f formed outside the third and fourth gate electrodes 32c and 32d are L3=0.25 μm.

Figure 8:
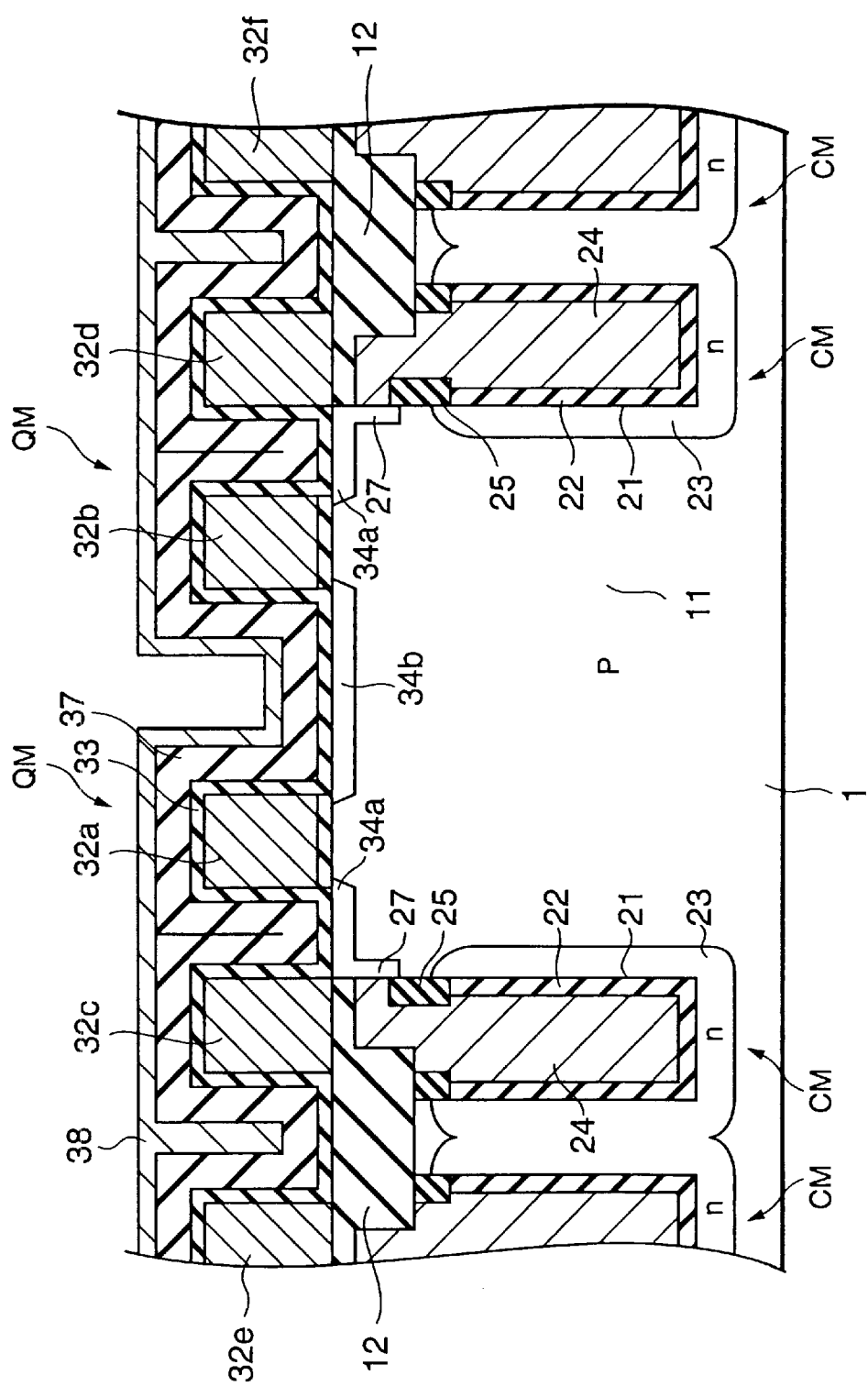
FIG. 8 is a sectional view showing a film deposition step for spacer insulating film formation in this embodiment.

The above steps will be described below by using only sectional views. As shown in FIG. 8, a 20-nm thick silicon oxide film 33, a 90-nm thick silicon nitride film serving as the side-wall insulating film 37, and a 75-nm thick amorphous silicon film 38 are deposited in this order on the substrate in which elements are formed as described above. The silicon oxide film 33 is a TEOS (tetraethyloxysilane) oxide film formed by CVD using TEOS as a material. This silicon oxide film 33 completely fills narrow spaces between the gate electrodes 32. The portions between first and second gate electrodes 32a and 32b and the third and fourth gate electrodes 32c and 32d, respectively, are filled flat only with the silicon nitride film 37. The amorphous silicon film 38 is deposited to fill narrow spaces remaining outside these gate electrodes. After that, this amorphous silicon film 38 is etched back by isotropic etching such as CDE (Chemical Dry Etching) and left behind only in the narrow spaces outside the third and fourth gate electrodes 32c and 32d.

Figure 10:
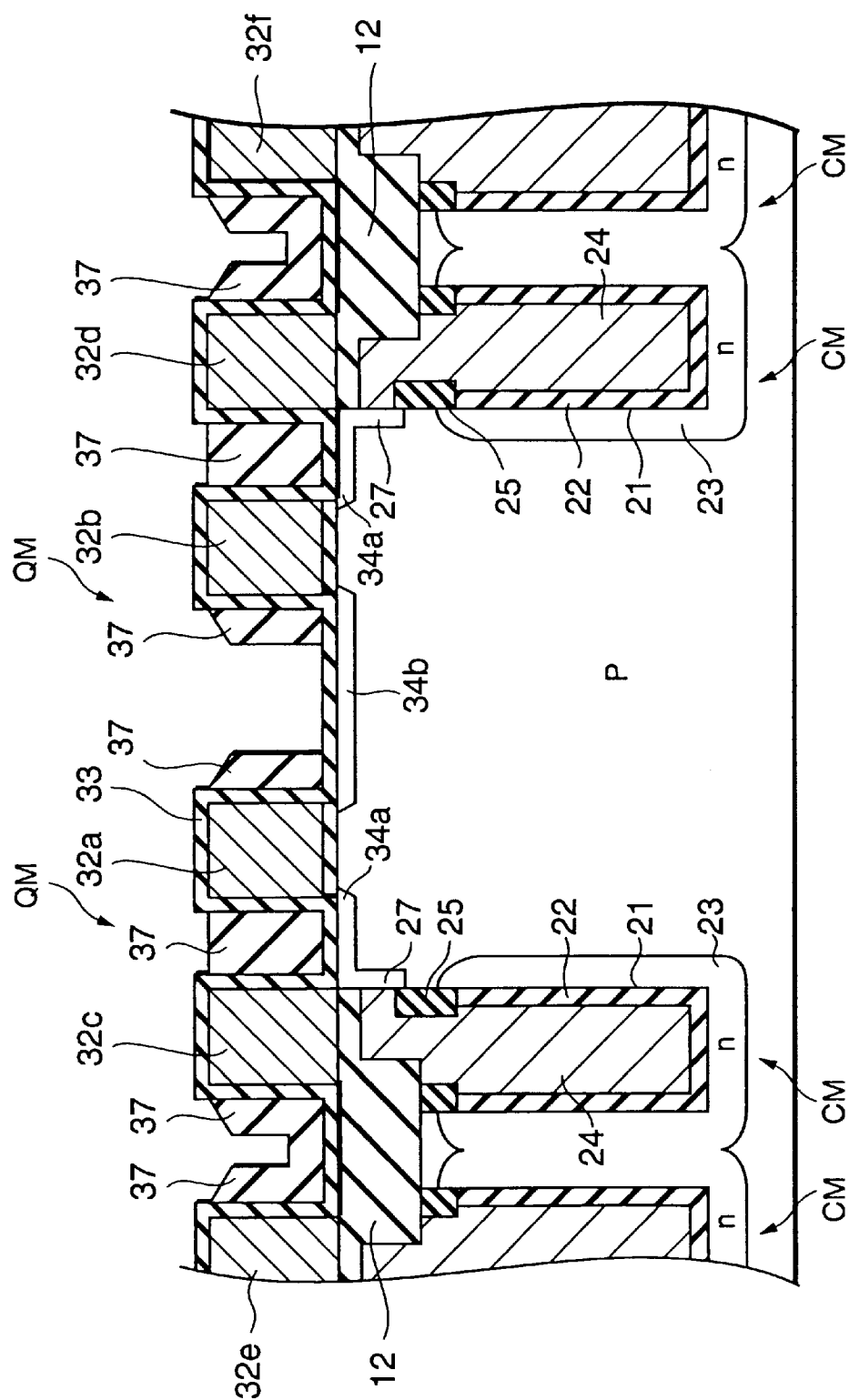
FIG. 10 is a sectional view showing a spacer insulating film formation step performed by silicon nitride film etching in this embodiment.

Next, the silicon nitride film is etched back by RIE (Reactive Ion Etching) having large etching selectivity to the silicon oxide film and amorphous silicon. Consequently, as shown in FIG. 10, the spacer insulating film 37 is formed on the side walls of the gate electrodes 32. As in FIG. 10, the spacer insulating film 37 is separated to expose the TEOS oxide film 33 between the first and second gate electrodes 32a and 32b having a large space between them. Since spaces are small between the remaining gate electrodes, the spacer insulating film 37 continues to completely fill these spaces.

Figure 9:
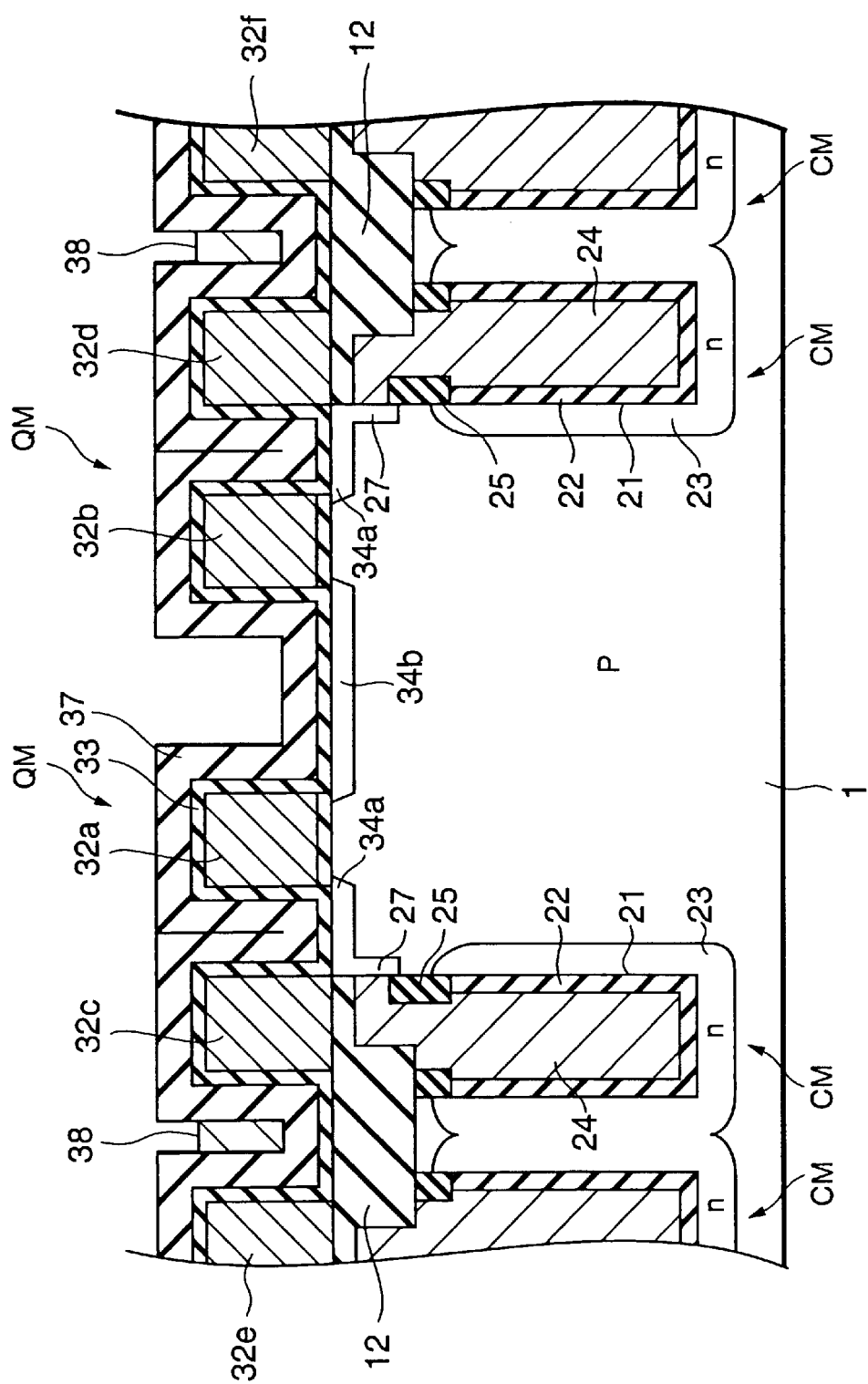
FIG. 9 is a sectional view showing an amorphous silicon burying step for spacer insulating film formation in this embodiment.

Note that the steps of depositing and etching the amorphous silicon film 38 explained in FIGS. 8 and 9 are additional steps. For example, the deposition and etching steps of the amorphous silicon film 38 are unnecessary if each gate electrode space except that between the first and gate electrodes 32a and 32b is ½ or less the total film thickness of the silicon oxide film 33 and the silicon nitride film 37.

Figure 11:
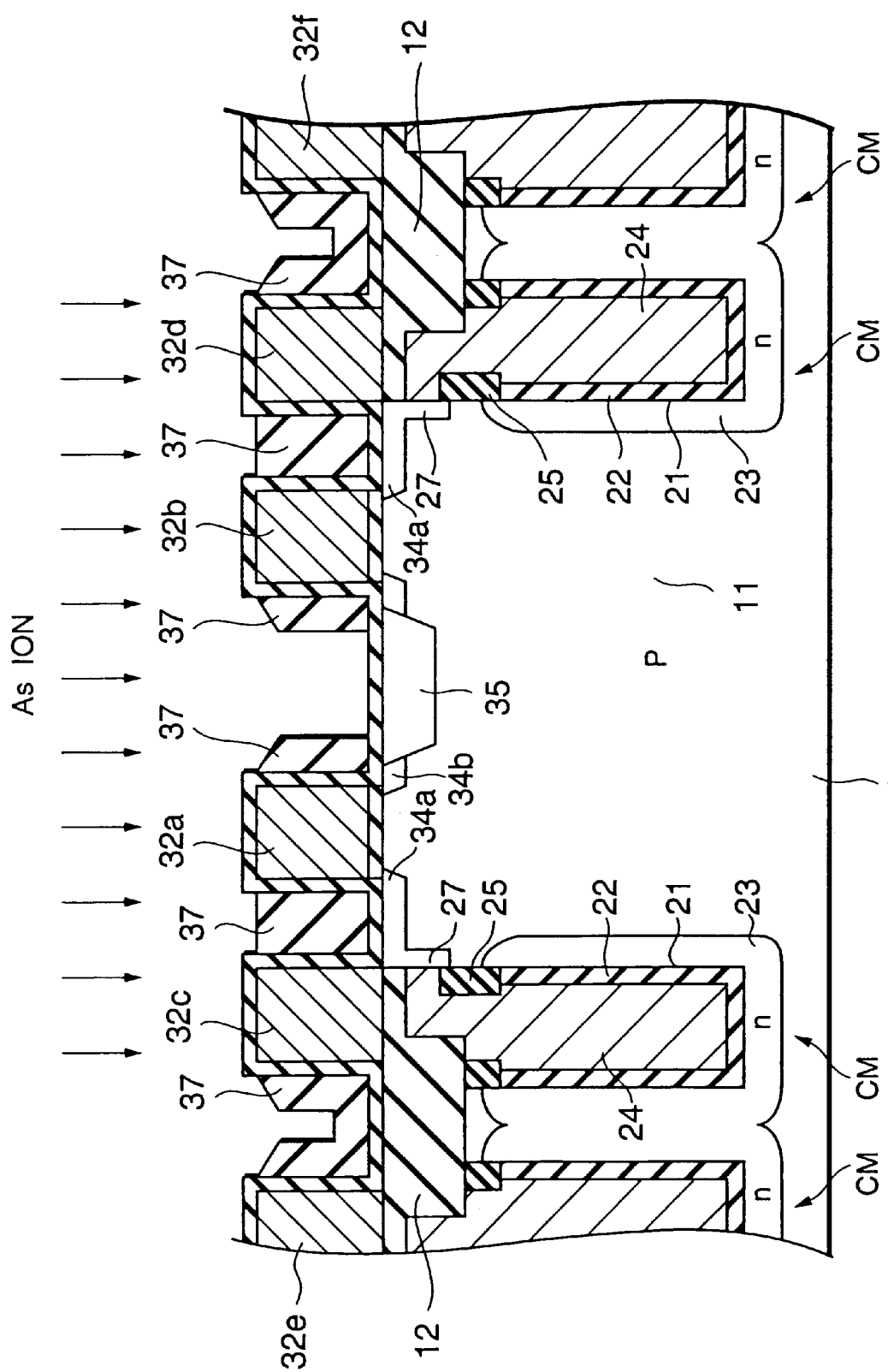
FIG. 11 is a sectional view showing an As ion implantation step for silicide film formation in this embodiment.

After that, as shown in FIG. 11, As (arsenic) ion implantation is performed to form the heavily doped n⁻-type diffusion layer 35 on the second n-type diffusion layer 34b between the first and second gate electrodes 32a and 32b. At the same time, As is doped into the gate electrodes 32 to form an n⁺-type layer. No As is doped into the first n-type diffusion layer 34a connected to the capacitor node 24 because this first n-type diffusion layer 34a is masked with the spacer insulating film 37. The n⁻-type diffusion layer 35 is activated by annealing after the ion implantation.

Figure 12:
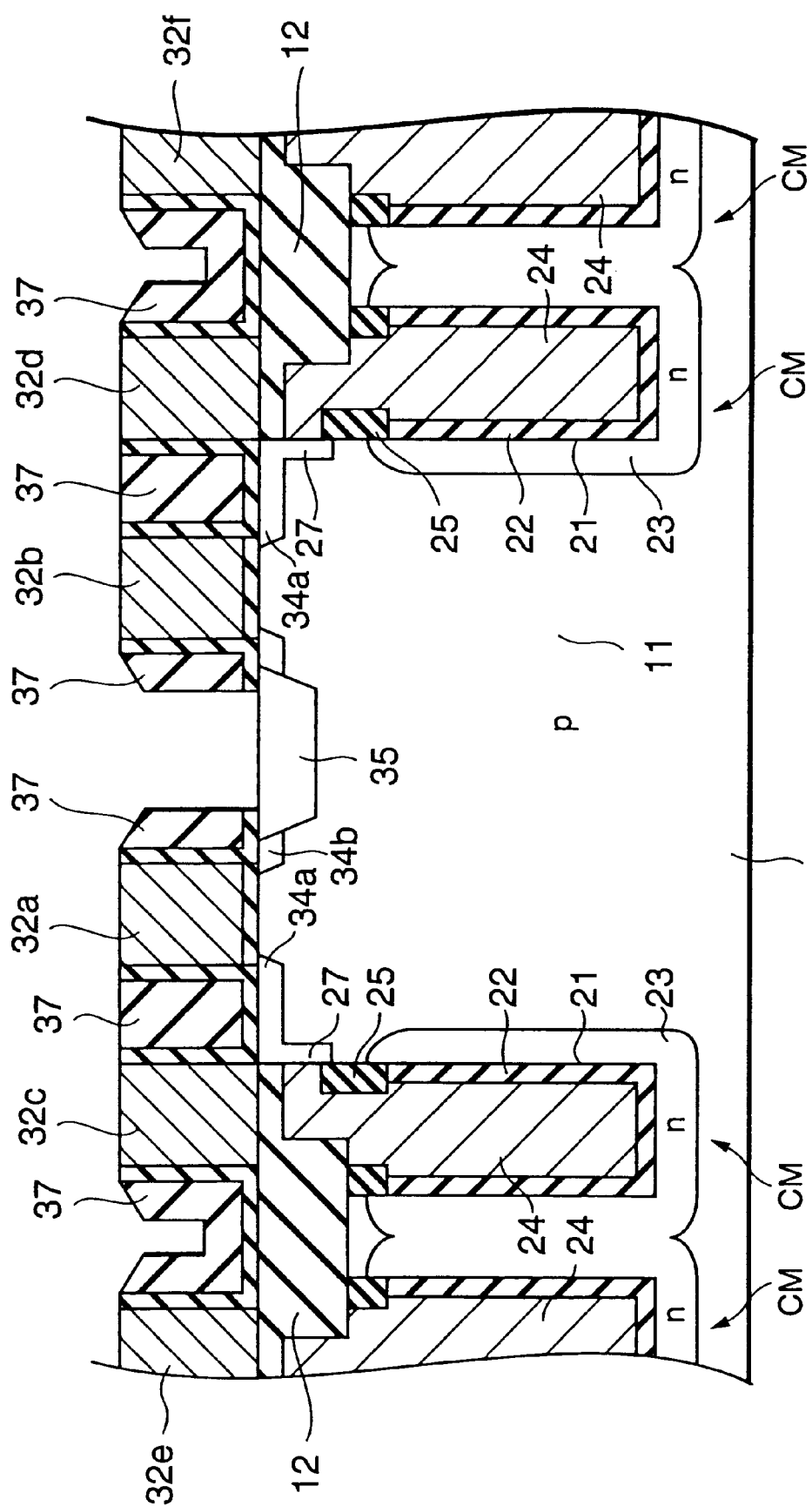
FIG. 12 is a sectional view showing an oxide film etching step for silicide film formation in this embodiment.

The silicon oxide film 33 remaining on the gate electrodes 32 and the bit line contacts are removed by a hydrofluoric acid-based etching solution. Consequently, as shown in FIG. 12, the n⁺-type diffusion layer 35 between the first and second gate electrodes 32a and 32b and the silicon surfaces of the individual gate electrodes 32 are exposed. The surface of the first n-type diffusion layer 34a near the capacitor nodes 24 is not exposed because this surface is masked by the spacer insulating film 37 made of a silicon nitride film.

Figure 13:
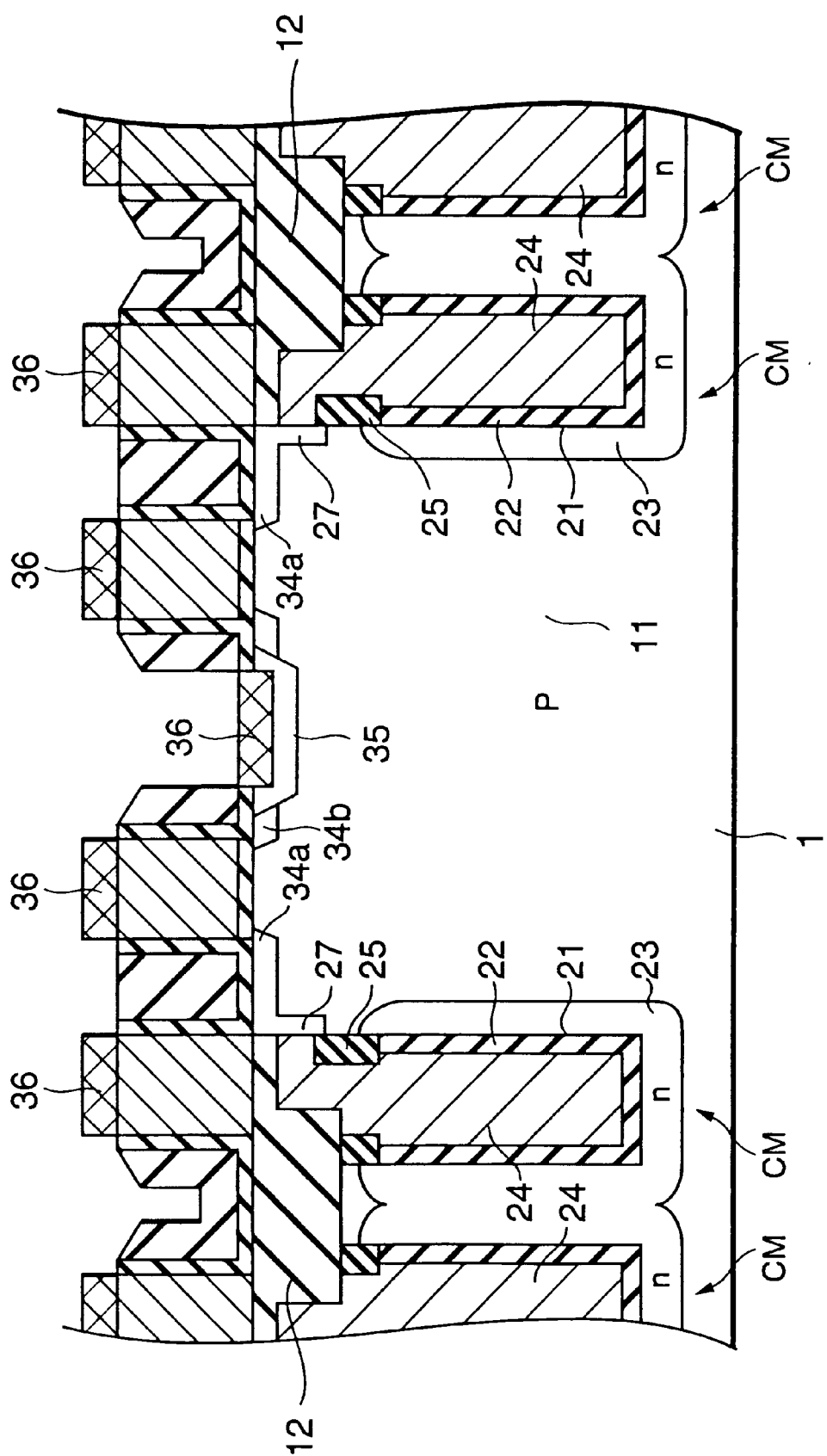
FIG. 13 is a sectional view showing a titanium silicide film formation step in this embodiment.

Next, as shown in FIG. 13, the titanium silicide film 36 is selectively formed on the n⁻-type diffusion layer 35 and the gate electrodes 32. Details of this step are as follows. First, As is ion-implanted to make the exposed silicon surface amorphous. A Ti (titanium) film and TiN (titanium nitride) film about 30 nm thick are successively deposited. After that, annealing is performed by, e.g., RTA (Rapid Thermal Anneal) to react the Ti/TiN film with silicon to form the titanium silicide film 36. Finally, the unreacted Ti/TiN film is selectively etched away.

After that, as shown in FIG. 2, the plasma CVD silicon nitride film 41 about 30 nm thick and the BPSG film 42 about 700 nm thick are deposited and planarized as the insulating interlayer 4. The contact hole 43 is formed in the bit line contact, and the W film 44 is buried in this contact hole 43. The bit line 5 is then formed by patterning.

In the above embodiment, a logic/DRAM hybrid device can be formed by a relatively simple fabrication process while high performance is maintained. In a simple DRAM strongly required to have a high density, it is necessary to minimize the gate electrode space of a MOS transistor in a DRAM cell array, i.e., the word line space. To this end, a bit line self-alignment contact technique is used to allow a bit line to contact the space between fine gate electrodes. This bit line self-alignment contact requires a step of covering the surfaces of the individual gate electrodes with a silicon nitride film in order to prevent a short circuit between a bit line and a word line.

In the case of a logic/DRAM hybrid device, on the other hand, it is more important to simplify the fabrication process and realize high performance than to increase the scale and density of the DRAM. From this viewpoint, as explained with reference to FIGS. 1 and 2, the gate electrodes 32 are formed into bent patterns to widen the bit line contact. Also, a titanium silicide film is adhered to all diffusion layers in the logic circuit and the DRAM cell array, except a diffusion layer connected to the capacitor node of a DRAM cell transistor. This prevents an increase in leakage when a silicide film is formed on the diffusion layer connected to the capacitor node and thereby realizes an excellent charge holding characteristic. At the same time, the resistance of source and drain diffusion layers can be reduced.

Furthermore, the above embodiment does not use the self-alignment contact technique for the bit line contact, so the gate electrodes are not covered with a silicon nitride film. Therefore, a titanium silicide film can be formed on the gate electrodes in the DRAM cell array as well as on the source and drain diffusion layers. Additionally, this titanium silicide film is formed on all the diffusion layers except a specific diffusion layer and on the gate electrodes by selective growth not using any complicated mask step.

That is, by using the combination of the gate electrode pattern design and the side-wall insulating film formation step, a titanium silicide film self-aligned with each diffusion layer and gate electrode is formed. As is apparent from FIGS. 2 and 3, by giving basically the same structure to the MOS transistors in the logic circuit and the DRAM cell array, a common fabrication process can be applied to the logic circuit and the DRAM cell array.

The present invention is not limited to the above embodiment. For example, a predetermined effect can be obtained when the present invention is applied to only a DRAM. That is, even in only a DRAM, when a metal silicide film is not formed on a first impurity diffusion layer near a capacitor node of a DRAM cell transistor and is formed only on a second impurity diffusion layer, the resistance of this second impurity diffusion layer near a bit line contact can be reduced while a good charge holding characteristic of a capacitor is maintained.

In the above embodiment, a DRAM having a trench capacitor structure is explained. However, the present invention is similarly effective to a DRAM having a stacked capacitor structure. In a stacked capacitor DRAM, leakage from a diffusion layer near a capacitor deteriorates the charge holding characteristic as in a trench capacitor DRAM. Therefore, a metal silicide film is not formed on a first diffusion layer near the capacitor and is formed on a second diffusion layer near a bit line contact. Consequently, as in the above embodiment, it is possible to prevent deterioration of the signal charge holding characteristic caused by junction leakage from a signal storage node. This achieve high-speed performance without increasing the number of fabrication steps.

Furthermore, the present invention can be applied to a MOS transistor circuit other than a DRAM. For example, similar to a DRAM cell MOS transistor, a MOS transistor integrated circuit can be used such that one of source and drain diffusion layers, e.g., a source diffusion layer is connected to a signal storage node capable of floating. An analogous effect can be obtained by this MOS transistor by giving the MOS transistor the same structure as the DRAM cell MOS transistor of the above embodiment and forming a metal silicide film on the surfaces of both source and drain diffusion layers of other MOS transistors.

Figure 24:
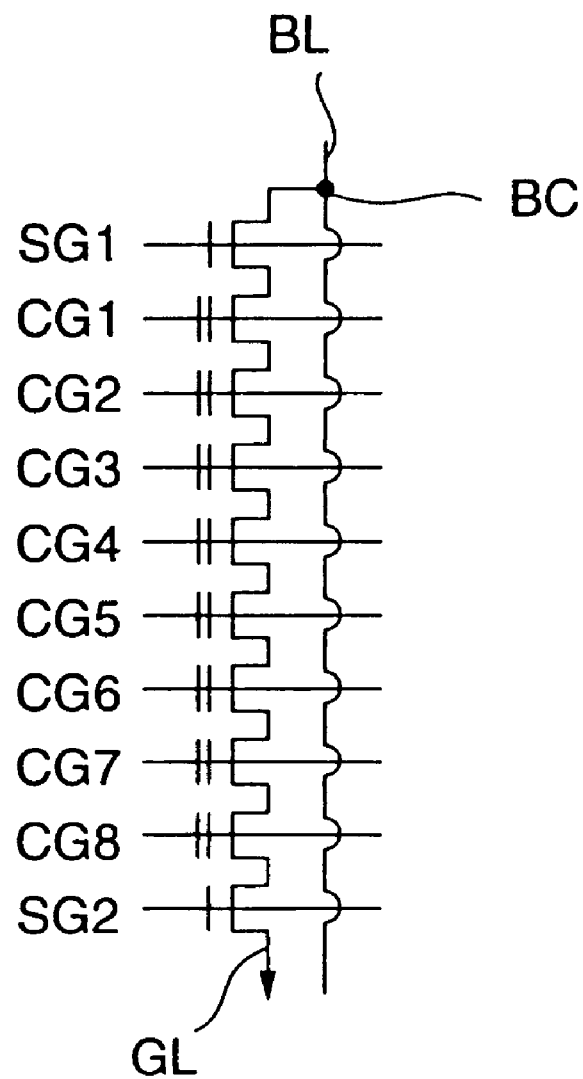
FIG. 24 is a circuit diagram showing the arrangement of a NAND flash memory.

The present invention is also applicable to a flash memory as one example of circuits other than a DRAM. This application will be described below. FIG. 24 shows the circuit configuration of a NAND flash memory. Referring to FIG. 24, the source and drain of a selector gate SG1, the sources and drains of eight control gates CG1 to CG8, and the source and drain of a selector gate SG2 are connected in series between a bit line BL and a ground line GL. One terminal of the selector gate SG1 is connected to the bit line BL via a bit line contact BC.

Figure 25:
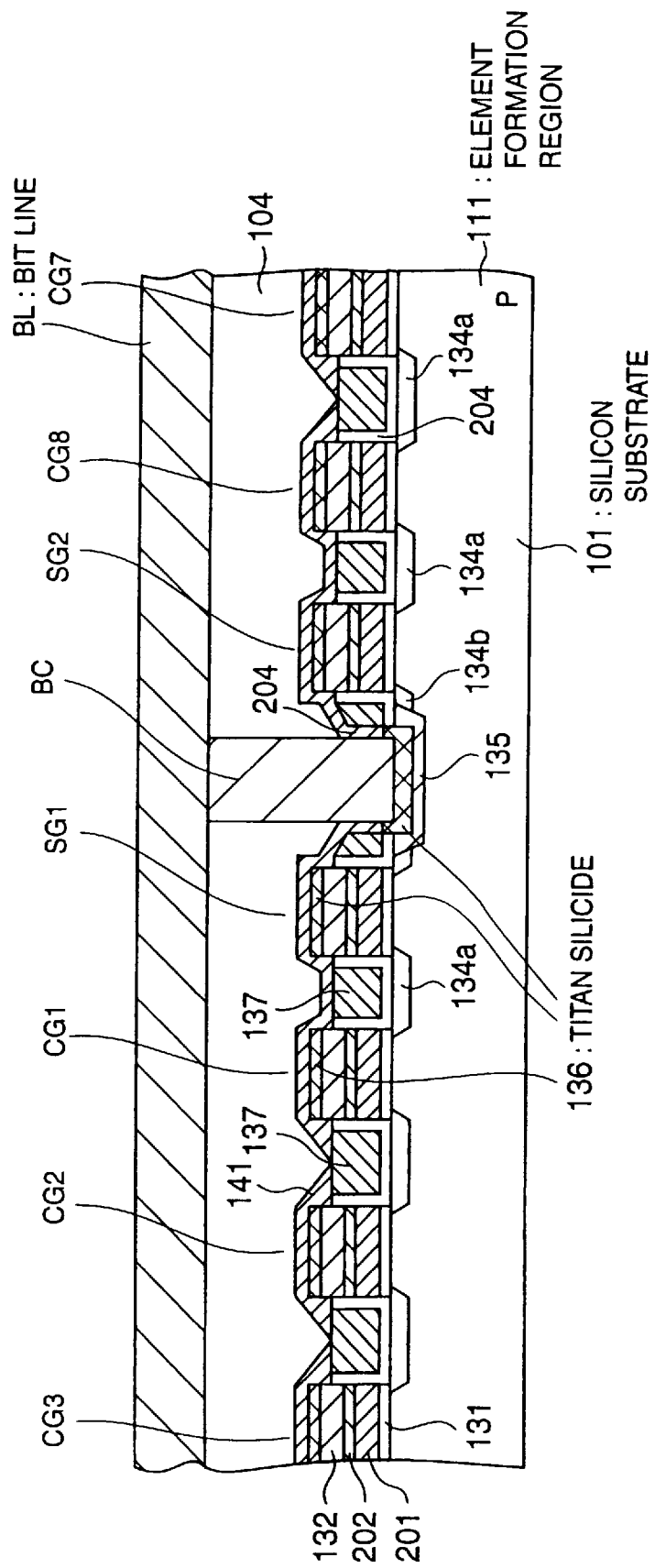
FIG. 25 is a longitudinal sectional view showing an arrangement when the above first embodiment is applied to a NAND flash memory.

FIG. 25 shows the longitudinal sectional structure of this flash memory. This structure is equivalent to removing the trench capacitors CM from the DRAM according to the above embodiment and forming the selector gate SG1, the eight control gates CG1 to CG8, and the selector gate SG2 between the bit line contacts BC.

In an element region 111, a MOS transistor as the selector gate SG1 and MOS transistors having floating gates as the control gates CG1 to CG8 are formed. To use the same fabrication process, the selector gates SG1 and SG2 also have floating gates as a transistor structure similar to the control gates CG1 to CG8. However, these flowing gates are not used in circuit operation.

The MOS transistors as the selector gates SG1 and SG2 have a floating gate electrode 201 formed on a silicon substrate 101 via a gate insulating film 131, an ONO (Oxide-Nitride-Oxide) film 202 formed as an intermediate insulating film on the floating gate electrode 201, a gate electrode 132 formed on the surface of this ONO film 202, and first and second n-type diffusion layers 134a and 134b self-aligned with the gate electrode 132. The first diffusion layer 134a is, e.g., a source region. The second diffusion layer 134b is, e.g., a drain region and connected to the bit line BL via the bit line contact BC. As shown in FIG. 25, each gate electrode 132 is continuously formed in one direction to serve as a word line WL.

In this NAND flash memory, of the first and second diffusion layers 134a and 134b of the MOS transistor, a heavily doped n$^+$-type layer 135 is formed only on the second diffusion layer 134b. A titanium silicide film 136 is formed on the surface of this n$^+$-type layer 315. No titanium silicide film is formed on the first diffusion layer 134a. This titanium silicide film 136 is also formed on the gate electrodes 132 of the control gates CG1 to CG8.

In this structure, the selector gate SG1 functions as a switching element for determining whether signal charge is to be stored, and corresponds to the transistor QM in the DRAM according to the above first embodiment. The eight control gates CG1 to CG8 are elements for storing signal charge and correspond to the trench capacitors in the above-mentioned DRAM. Therefore, of the two diffusion layers 134a and 134b of the selector gate SG1, no titanium silicide film is formed on the surface of the diffusion layer 134a connected to the signal storage node of the control gate CG1. The titanium silicide film 136 is formed on the surface of the diffusion layer 134b connected to the bit line contact BC.

In this flash memory, as in the DRAM according to the above first embodiment, of the first and second diffusion layers 134a and 134b of the selector gates SG1 and SG2, the titanium silicide film 136 is formed only on the second diffusion layer 134b without using any special mask step. This is accomplished by a self-alignment step improving the layout of the gate electrodes 132.

In the above embodiment, a titanium silicide film is used as a material for reducing the resistance of a silicon layer. However, another metal silicide film can also be used. Preferable metal silicide has a low resistivity and can be selectively grown on a silicon layer.

The second embodiment of the present invention will be described below.

Figure 14:
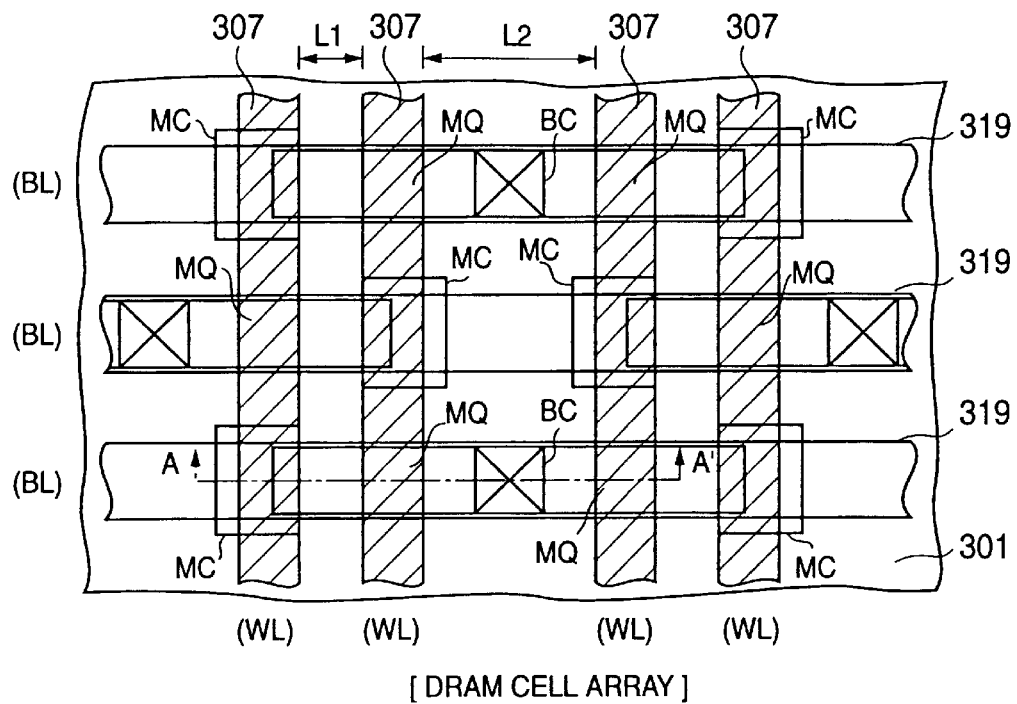
FIG. 14 is a view showing the layout of a DRAM cell array according to another embodiment of the present invention.

FIG. 14 shows the layout of a DRAM cell array region of a DRAM/logic hybrid semiconductor device according to this embodiment of the present invention. MOS transistors MQ and capacitors MC constructing DRAM cells are arranged as shown in FIG. 14. Each MOS transistor MQ transfers information. Gate electrodes 307 of the MOS transistors MQ are continuously formed in one direction to serve as word lines WL. Bit lines BL formed to cross the word lines WL are connected to the MOS transistors MQ via bit line contacts BC.

Figure 15:
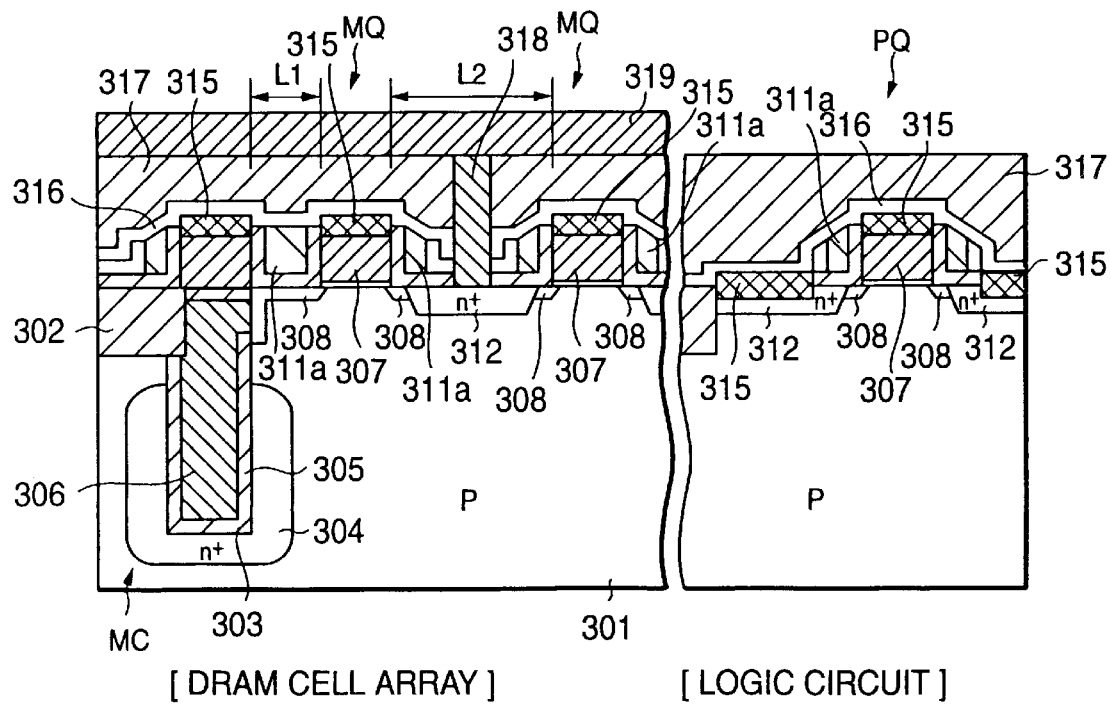
FIG. 15 is a sectional view showing a DRAM cell array region and a logic circuit region in this embodiment.

FIG. 15 shows a section taken along a line A-A' of the DRAM cell array region shown in FIG. 14 and a section of one transistor PQ in a logic circuit. In the MOS transistor PQ in this logic circuit, a metal silicide film 315 is formed on the upper surfaces of a source/drain diffusion layer 312 and gate electrode 307. In contrast, in the MOS transistor MQ in the DRAM cell array, no metal silicide film is formed on the surface of a source/drain diffusion layer 312. A metal silicide film 315 is formed only on the upper surfaces of gate electrodes 307.

In a bit line contact region in the DRAM cell array, the distance between the gate electrodes is L2 which is longer than a distance L1 between the gate electrodes in other portions of the DRAM cell array. Therefore, a silicon nitride film 311a is formed as a side-wall insulating film in the bit line contact region, whereas this silicon nitride film 311a is buried between the gate electrodes in other portions.

In the DRAM cell array region, a contact plug 318 electrically connected to the source/drain diffusion layer 312 is formed in a BPSG film 317 as an insulating interlayer. In addition, a bit line 319 electrically connected to the contact plug 318 is formed on the upper surface of the BPSG film 317.

Also, a trench capacitor MC is formed in a silicon substrate 301. This capacitor MC includes a capacitor node 306, a capacitor insulating film 305, and an n-type diffusion layer 304 as a plate electrode. The capacitor node 306 is electrically connected to one of source and drain regions 308.

For example, a cobalt silicide film or titanium silicide film is used as the metal silicide film 315. When a cobalt silicide film is used as the metal silicide film, micropatterning of elements progresses. As a consequence, the sheet resistance does not increase even when processing of, e.g., about 2 μm or less is performed.

Figure 16:
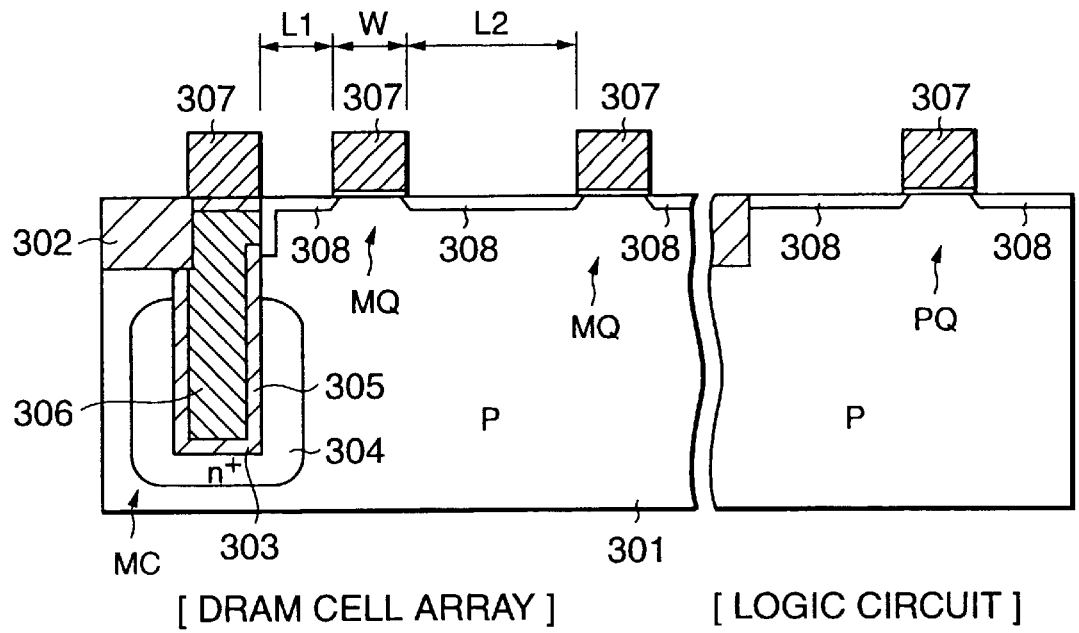
FIG. 16 is a sectional view for explaining a fabrication step in this embodiment.

Steps of fabricating the sections shown in FIG. 15 of this embodiment will be described below with reference to FIGS. 16 to 23. As shown in FIG. 16, the trench capacitor MC is formed in the DRAM cell array region of the p-type silicon substrate 301, and a necessary element isolation insulating film 302 is also formed. The capacitor MC has a trench 303 formed in the silicon substrate 301, the capacitor insulating film 305 formed on the inner surfaces of the trench 303, and the capacitor node 306 made of n$^+$-type polysilicon buried in the trench 303. The n$^+$-type diffusion layer 304 is formed on the side surfaces of the trench 303 by impurity diffusion. The element isolation insulating film 302 is buried by STI (Shallow Trench Isolation).

After that, a 20-nm thick polysilicon film is deposited on the silicon substrate 301 via a gate oxide film, and the gate electrodes 307 are patterned by lithography and RIE. In the DRAM cell array region, as shown in FIG. 14, the gate electrodes 307 are continuously patterned in one direction to serve as the word lines WL. In this DRAM cell array region, the pitches between the gate electrodes 307 are nonuniform. That is, the space L2 between a certain gate electrode and an adjacent gate electrode on the capacitor MC side is twice or more the space L1 between this certain gate electrode and an adjacent gate electrode on the bit line contact BC side. More specifically, L1=0.175 μm and L2=0.5 μm in this embodiment. A width W of the gate electrode 307 is W=0.175 μm.

After the gate electrodes 307 are formed as described above, phosphorus is ion-implanted into the gate electrodes 307 by self-alignment, and high-temperature annealing is performed to form then n$^-$-type diffusion layers 308 as lightly doped impurity diffusion layers in the source and drain regions. The ion implantation conditions are an acceleration voltage of 20 keV and a dose of 3.5E13/cm$^2$. An opening in which the capacitor node 306 is exposed is formed in the upper end portion of the capacitor MC. The impurity in the capacitor node 306 diffuses outward from this opening to connect the n-type diffusion layer 308, on the side of the capacitor MC, of the MOS transistor MQ to the capacitor node 306. This MOS transistor MQ functions as an information transfer transistor for transferring information stored in the capacitor MC.

Figure 17:
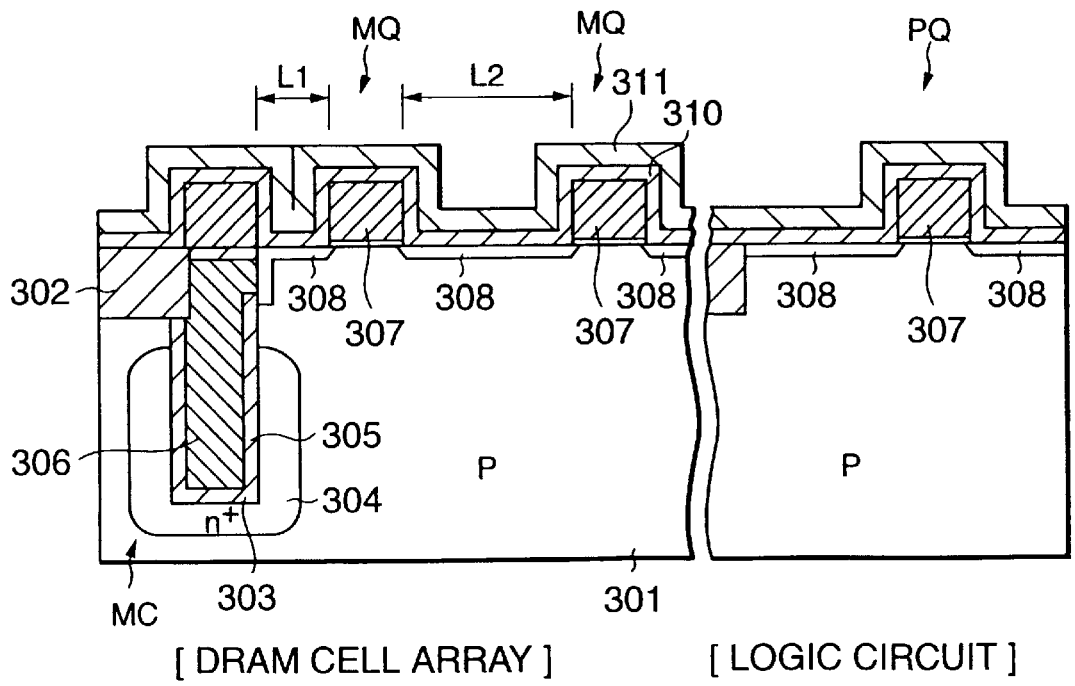
FIG. 17 is a sectional view for explaining a fabrication step in this embodiment.

Next, as shown in FIG. 17, a 20-nm thick silicon oxide film 310 and a 70-nm thick silicon nitride film 311 are deposited in this order. In the DRAM cell array region, the narrower space L1 between the gate electrodes 307 is 150 nm. In this DRAM cell array region, therefore, the silicon nitride film 311 completely fills the narrower space L1 of the spaces L1 and L2 between the gate electrodes 307 because the silicon oxide film 310 has the above thickness. Note that this process can also be performed by using a method by which the silicon nitride film 311 is first deposited to have a thickness of about 150 nm and then etched to leave a 70-nm thick film by isotropic etching using a phosphoric acid-based etching solution or the like. By the use of this method, the silicon nitride film 311 can be completely buried in the space L1 regardless of process variations. Although the silicon nitride film 311 need not be completely buried in the space L1, it is advantageous to completely bury this film to achieve micropatterning of elements.

Figure 18:
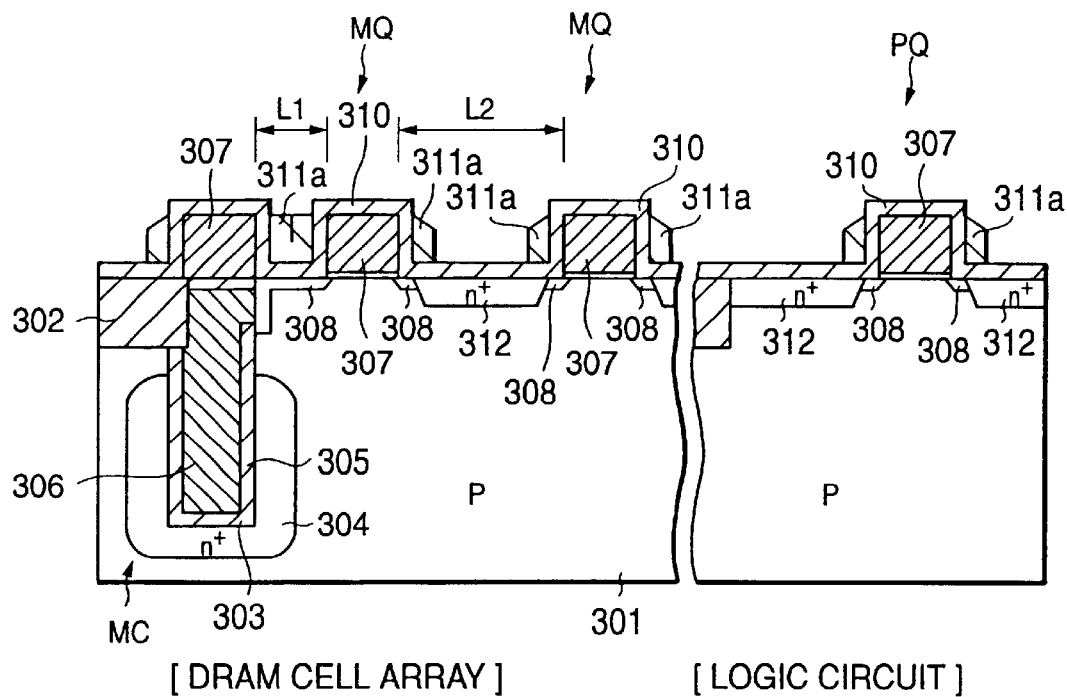
FIG. 18 is a sectional view for explaining a fabrication step in this embodiment.

As shown in FIG. 18, the silicon nitride film 311 is etched by RIE and left behind as the side-wall insulating films 311a on the side surfaces of the gate electrodes 307. In the DRAM cell array region, the narrower space L1 of the two spaces between the gate electrodes 307 is filled with the adjacent side-wall insulating films 311a contacting each other. In the wider space L2, the side-wall insulating films 311a are formed at a predetermined distance.

After that, self-aligned arsenic ion implantation and high-temperature annealing are performed for the gate electrodes 307 and the side-wall insulating films 311a. The ion implantation conditions are an acceleration voltage of 65 keV and a dose of 4E15/cm$^2$. Consequently, the n$^+$-type diffusion layers 312 are formed as heavily doped impurity diffusion layers on the n$^-$-type diffusion layers 308 in the source and drain regions of the MOS transistors MQ and PQ. In the DRAM cell array region, however, this n$^+$-type diffusion layer is not formed because the narrow space L1 between the gate electrodes 307 is completely covered with the side-wall insulating films 311a. Accordingly, both the source and drain regions of the MOS transistor PQ in the logic circuit have an LDD structure, and only a region of the MOS transistor MQ near the bit line contact BC has an LDD structure in the DRAM cell array region. In this ion implantation step, arsenic is also doped into each gate electrode 307 to decrease the resistance of the gate electrode 307.

Figure 19:
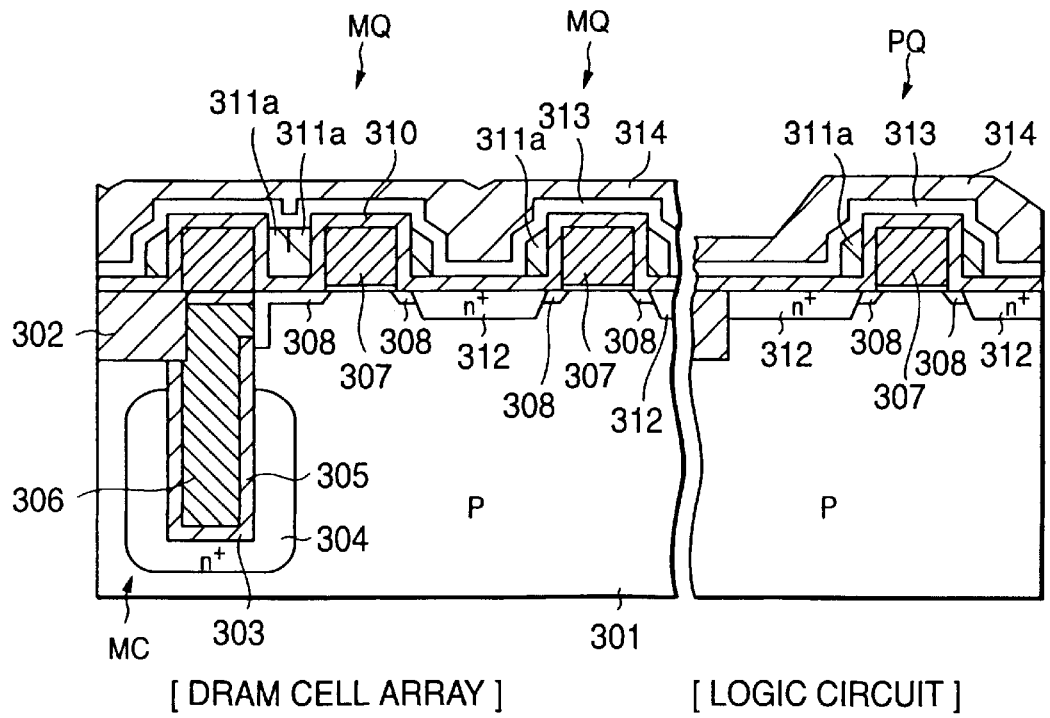
FIG. 19 is a sectional view for explaining a fabrication step in this embodiment.

As shown in FIG. 19, a thin silicon nitride film 313 about 20 nm thick is deposited on the entire surface of the substrate. Subsequently, a thick silicon oxide film 314 about 300 nm thick is deposited. This silicon oxide film 314 is planarized by performing at least one of high-temperature reflow and CMP. When both the reflow and CMP are performed, it is possible to prevent the formation of hollow portions called "cavities" in the silicon oxide film 314 and ensure the flatness of the film.

Figure 20:
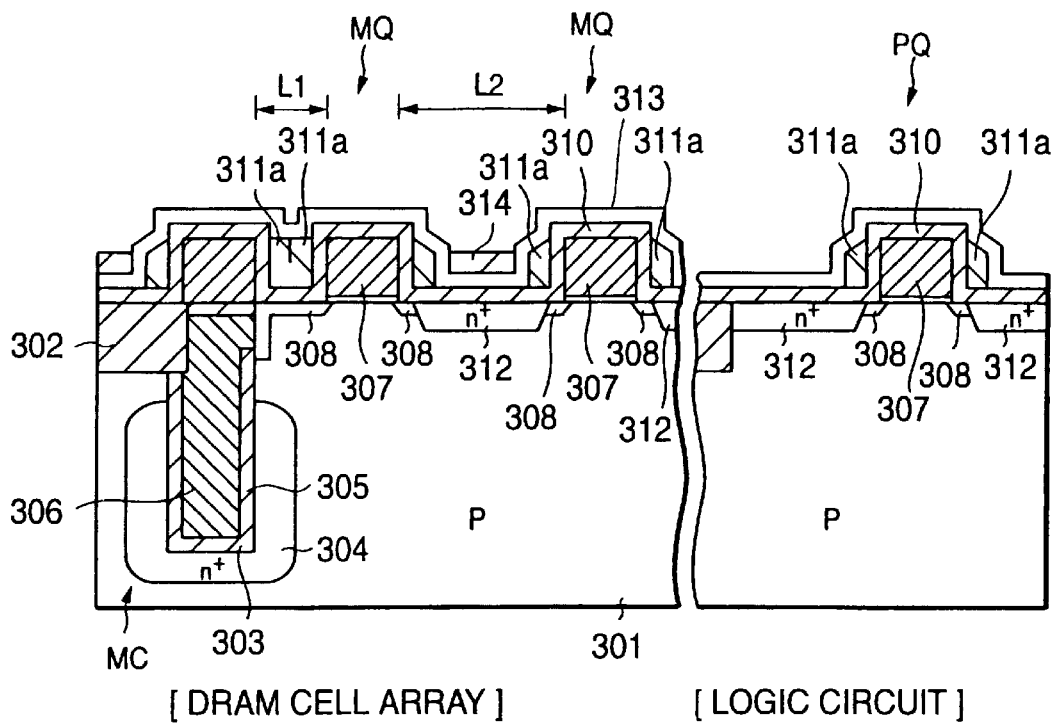
FIG. 20 is a sectional view for explaining a fabrication step in this embodiment.

Next, as shown in FIG. 20, the silicon oxide film 314 is removed by a predetermined thickness by wet etching using a hydrofluoric acid-based etchant. Consequently, the silicon oxide film 314 is left behind only in the wider space L2 of the spaces L1 and L2 between the gate electrodes in the DRAM cell array region. Since the logic circuit region has a wide space, the silicon oxide film 314 is completely removed.

To reliably remove the silicon oxide film 314 in the logic circuit region, however, a mask (not shown) covering the DRAM cell array region is formed to reliably etch away the silicon oxide film 314 by wet etching or the like when necessary.

Figure 21:
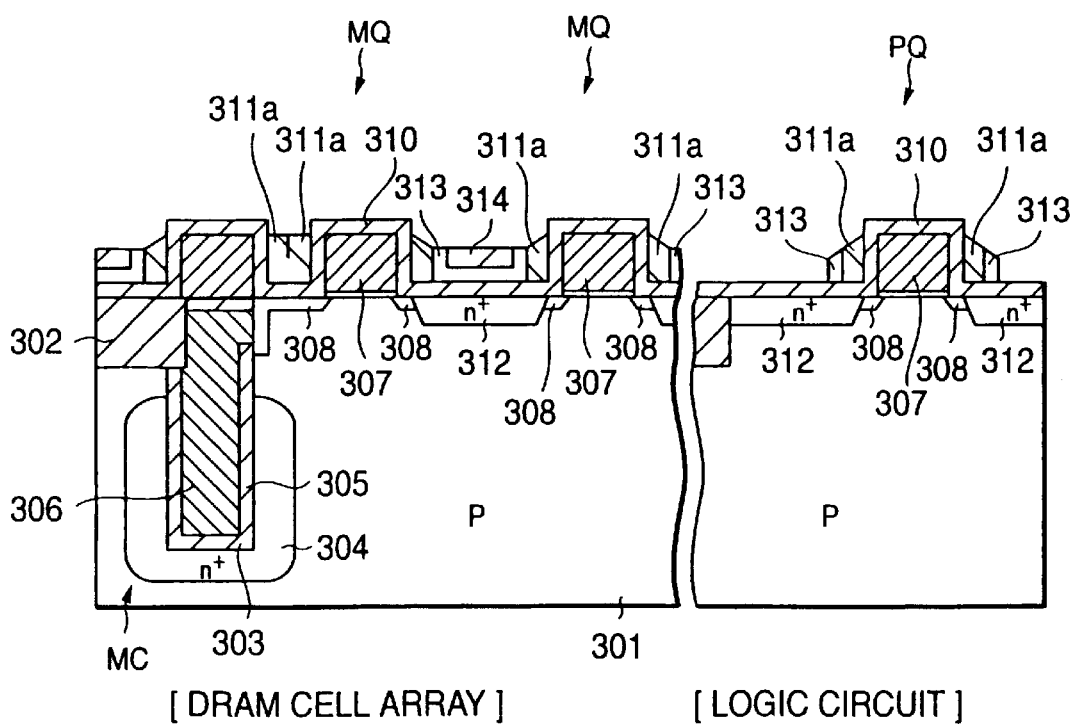
FIG. 21 is a sectional view for explaining a fabrication step in this embodiment.

As shown in FIG. 21, the silicon oxide film 314 is used as a mask to etch away the silicon nitride film 313 by RIE. As a consequence, this silicon nitride film 313 remains only in the space L2 covered with the silicon oxide film 314 and on the side surfaces of the side-wall insulating films 311a.

Figure 22:
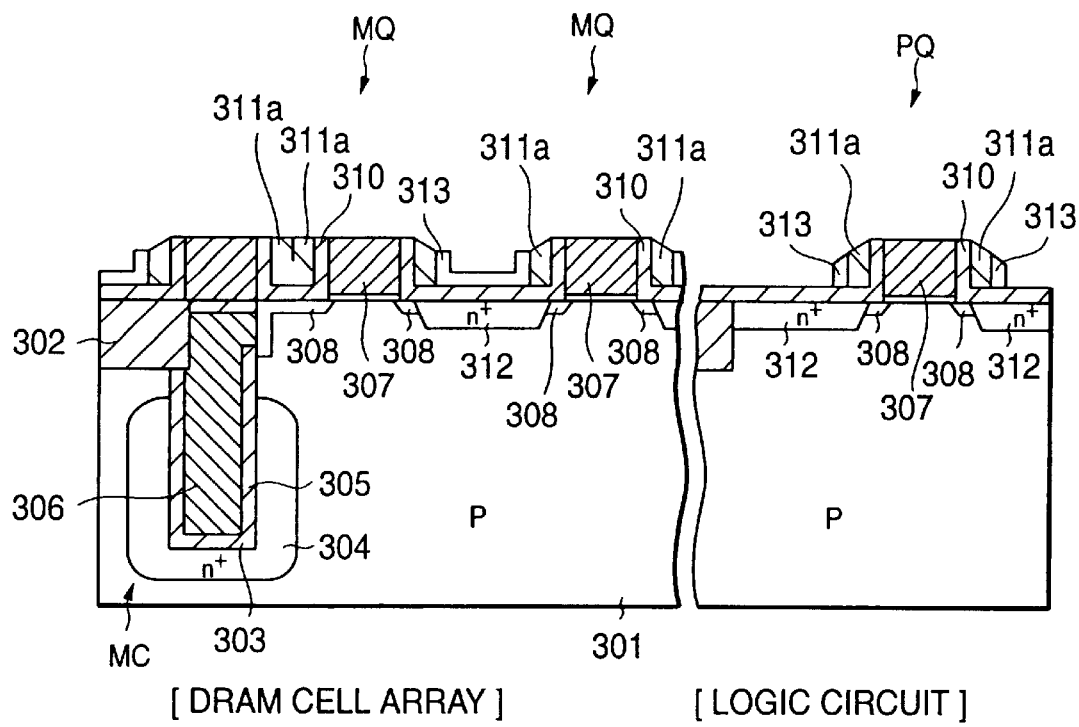
FIG. 22 is a sectional view for explaining a fabrication step in this embodiment.

As shown in FIG. 22, the silicon oxide films 310 and 31 are etched by hydrofluoric acid based wet etching. This exposes the surfaces of the gate electrodes 307 of the MOS transistors MQ and PQ and the surfaces of the n-type diffusion layers in the source and drain regions of the MOS transistor PQ in the logic circuit region. In the DRAM cell array region, however, the silicon nitride film 313 prevents the exposure of the source and drain regions 312. Although in practice the upper ends of the silicon oxide films 310 formed on the side surfaces of the gate electrode 307 recede, this is not shown in FIG. 22.

Figure 23:
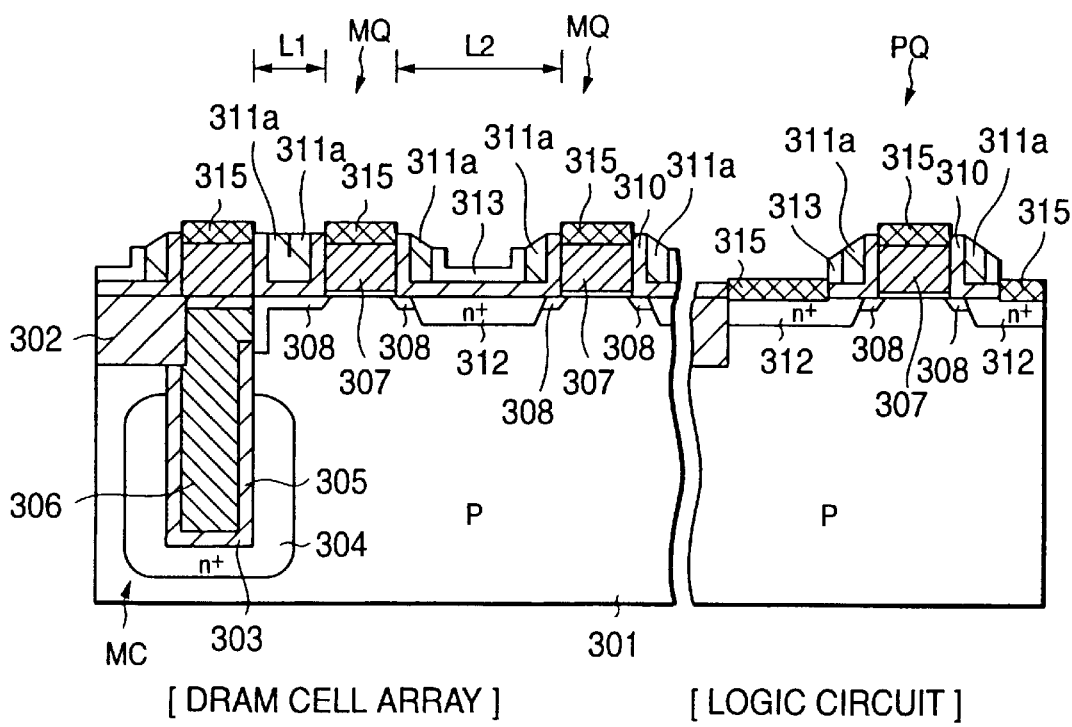
FIG. 23 is a sectional view for explaining a fabrication step in this embodiment.

Next, as shown in FIG. 23, the metal silicide film 315 is formed by self-alignment on the exposed surfaces of the gate electrodes 307 and the surfaces of the diffusion layers 315 in the source and drain regions in the logic circuit region. Practical steps of forming this metal silicide film 315 are as follows. First, a Co/Ti film about 100 to 200 nm thick is deposited on the entire surface. Next, in a non-oxygen ambient, e.g., a nitrogen ambient, annealing is performed at about 400° C. to 600° C. for about 60 min to silicify the Co/Ti in contact with silicon. CoSi is formed in this step. The unreacted Co/Ti film is etched away. In a non-oxygen ambient, e.g., a nitrogen ambient, annealing is performed at about 700° C. to 800° C. for about 30 min. Consequently, the CoSi changes into $CoSi_2$ which has lower resistance and is more stable. In the DRAM cell array region, no metal silicide film is formed because the source and drain regions are masked.

Although a cobalt silicide film is used as the metal silicide film 315, a titanium silicide film can also be formed as the metal silicide film 315 through the above steps by using Ti/TiN instead of the Co/Ti film. However, when a cobalt silicide film is used as the metal silicide film 315, micropatterning of elements progresses. As a consequence, the sheet resistance does not increase even when processing of, e.g., about 2 μm or less is performed.

After that, as shown in FIG. 15, a silicon nitride film 316 about 30 nm thick is deposited by plasma CVD. Subsequently, the BPSG film 317 is deposited and planarized by LPCVD. The silicon nitride film 316 functions as an etching stopper when contact holes are formed. Changes of properties of the metal silicide film 315 which is weak against high-temperature heat can be prevented by using plasma CVD at a relatively low temperature of about 400° C. to 500° C. to deposit the silicon nitride film 316. In the DRAM cell array region, a hole is formed in the bit line contact BC of the BPSG film 317, and the contact plug 318 is buried in this hole. After that, the bit line (BL) 319 is patterned on the BPSG film 317. This bit line 319 is connected to the $n^+$-type diffusion layer 312 of the MOS transistor MQ via the contact plug 318.

The bit line 319 and the contact plug 318 can also be simultaneously formed by using a dual damascene method. If this is the case, a contact hole is formed in the BPSG film 317, and an interconnection groove is formed in an interconnection burial region including this contact hole. After that, an interconnecting material is deposited and subjected to CMP. Although not shown in FIG. 15, a similar contact and interconnection can be formed in the logic circuit region at the same time they are formed in the DRAM cell area region.

Although the rest of the fabrication process is not shown, an insulating interlayer is deposited, and a metal interconnection is formed. This metal interconnection is usually a multilayered interconnection. Additionally, the uppermost metal interconnection is covered with a passivation film.

As described above, this embodiment provides a semiconductor device in which regions are separated in a single chip such that a metal silicide film is adhered to gate electrodes and source and drain regions in a logic circuit and this metal silicide film is adhered to only gate electrodes in a cell array, and a method of fabricating this semiconductor device. Accordingly, it is possible to improve the charge holding characteristic by suppressing junction leakage in both the source and drain regions of a MOS transistor in the cell array, and reduce the resistance of the gate electrodes in the cell array and the resistance in the logic circuit. Also, since a cobalt silicide film is used as the metal silicide film 315, an increase in sheet resistance can be prevented even when micropatterning of elements progresses.

The present invention is not limited to the above embodiment. Although a DRAM using a trench capacitor is explained in the above embodiment, the present invention is similarly effective to a DRAM using a stacked capacitor. This is so because even in a stacked capacitor DRAM leakage from a diffusion layer near a capacitor deteriorates the charge holding characteristic.

Accordingly, a metal silicide film is not formed on source and drain diffusion layers in a DRAM cell array region and formed only on source and drain diffusion layers in a logic circuit region. Consequently, an effect similar to that of the above embodiment can be obtained.

Furthermore, the present invention can be applied to a MOS transistor circuit other than a DRAM. For example, similar to a DRAM cell MOS transistor, a MOS transistor integrated circuit can be used such that one of source and drain diffusion layers, e.g., a source diffusion layer is connected to a signal storage node capable of floating. An analogous effect can be obtained by this MOS transistor by giving the MOS transistor the same structure as the DRAM cell MOS transistor of the above embodiment and forming a metal silicide film on the surfaces of both the source and drain diffusion layers of other MOS transistors.

Figure 26:
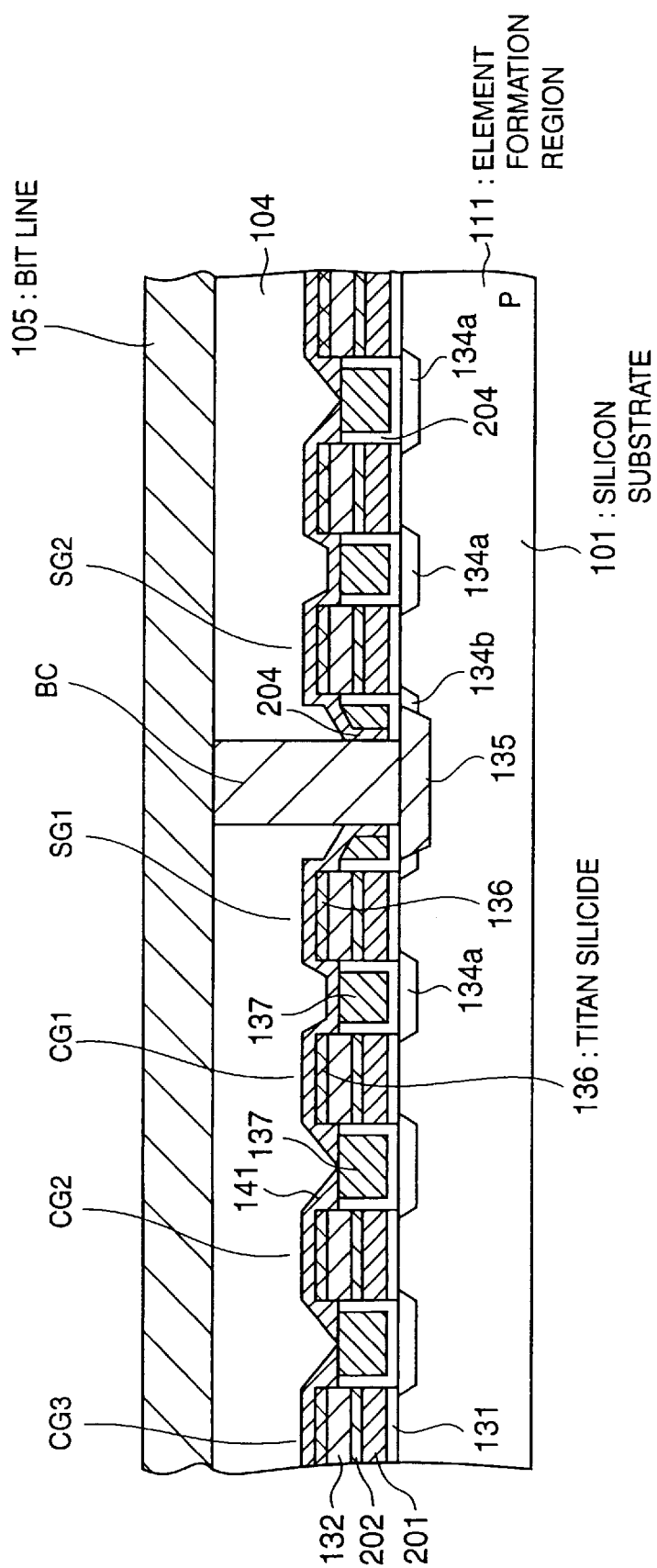
FIG. 26 is a longitudinal sectional view showing an arrangement when the above second embodiment is applied to a NAND flash memory.

As described in the first embodiment as well, the second embodiment is also applicable to a NAND flash memory. FIG. 26 shows the longitudinal sectional structure of a memory. A longitudinal sectional structure of a logic circuit is similar to that shown in FIG. 15 and a detailed description thereof will be omitted.

The structure of the memory shown in FIG. 26 is equivalent to removing the titanium silicide 136 on the surface of the $n^+$-type diffusion layer 135 in the structure of the memory shown in FIG. 25. That is, the titanium silicide film 136 is formed only on the gate electrodes 132 in the memory. In the logic circuit, as shown in FIG. 15, a metal silicide film 15 is formed on the upper surfaces of source and drain diffusion layers 12 and gate electrode 7 of a MOS transistor PQ. As described above, the present invention is also applicable to a flash memory, and an effect similar to that of the second embodiment can be obtained.

According to the present invention, as has been described above, high-speed performance of a MOS transistor circuit can be realized by selectively adhering a metal silicide film to two impurity diffusion layers of the MOS transistor while preventing deterioration of the signal holding characteristic resulting from junction leakage from a signal storage node. Especially when this invention is applied to a logic/DRAM hybrid device, superior characteristics can be achieved by a simple manufacturing process while an excellent charge holding characteristic or a DRAM is maintained.

Additionally, the present invention can improve the performance of a MOS transistor circuit while preventing deterioration of the signal holding characteristic by separating regions in a single chip such that a metal silicide film is adhered to gate electrodes and source and drain regions in a logic circuit and this metal silicide film is adhered only to gate electrodes in a memory cell array.

What is claimed is:

1. A method of fabricating a semiconductor device, comprising:

forming first and second trench capacitors, in each of which a capacitor node is buried, in two end portions of an element formation region of a semiconductor substrate;

patterning first and second gate electrodes arranged at a first interval in element formation region between said first and second trench capacitors and serving as word lines of two adjacent memory cells, and third and fourth gate electrodes passing over said first and second trench capacitors at a second interval small than the first interval from said first and second gate electrodes;

doping an impurity into the element formation region by using said gate electrodes as masks to form first impurity diffusion layers, connected to said capacitor nodes of said first and second trench capacitors, between said first and third gate electrodes and between said second and fourth gate electrodes, and simultaneously form a second impurity diffusion layer, shared by said two memory cells, between said first and second gate electrodes;

forming a spacer insulating film on side walls of said gate electrodes such that said spacer insulating film continues to cover said first impurity diffusion layers between said first arid third gate electrodes and between said second and fourth gate electrodes and is separated to expose said second impurity diffusion layer between said first and second gate electrodes;

forming a metal silicide film on said gate electrodes and said second impurity diffusion layer exposed between said first and second gate electrodes; and forming a bit line connected to said second impurity diffusion layer via said metal silicide film.

2. A method of fabricating a semiconductor device comprising:

forming a capacitor constructing a memory cell in a memory cell array region of a semiconductor substrate;

forming a first transistor in the memory cell array region of said semiconductor substrate, said first transistor comprising a gate electrode which is continuously formed to serve as a word line and source and drain diffusion layers one of which is connected to said capacitor and the other one of which serves as a bit line contact layer, and said gate electrodes being arranged at nonuniform pitches such that a spays between a certain gate electrode and an adjacent gate electrode on the side of said capacitor is smaller than a space between said certain gate electrode and do adjacent gate electrode on the side of said bit line contact and simultaneously forming a second transistor in a logic circuit region;

forming a side-wall insulating film an side surfaces of said gate electrodes of said first and second transistors so as to fill the narrower space of the spaces between said gate electrodes in the memory cell array region;

forming a heavily doped impurity diffusion layer self-aligned with said gate electrodes and said side-wall insulating film and said source and drain diffusion layers of said first and second transistors;

sequentially depositing a first insulating film of the same kind as said side-wall insulating film and a second insulating film of a different kind from said side-wall insulating film on said semiconductor substrate;

etching said second insulating film fin leave only the wider space of the spaces between said gate electrodes in the memory cell array region; etching away said first insulating film by using said second insulating film as a mask to expose a surface of said gate electrode of said first transistor in the memory cell array region and surfaces of said source and drain diffusion layers and gate electrode of said second transistor in the logic circuit region; and forming a metal silicide film by self-alignment on the surface of said gate electrode of said first transistor and on the surfaces of said source arid drain diffusion layers and gate electrode of said second transistor.

3. A method of fabricating a semiconductor device comprising:

forming a first capacitor and a second capacitor constructing memory cells in a memory cell array region of a semiconductor substrate;

forming first, second, third and fourth word lines above the semiconductor substrate, a first spacing between the first word line and the second word line being equal to a second spacing between the third word line and the fourth word line, and the first/second spacing being smaller than a third spacing between the second word line and the third word line; said second word line being used to transfer charges from/to the first capacitor, and said third word line being used to transfer charges from/to the second capacitor;

implanting impurity ions in surface areas of the substrate in the first through three spacings to form a first doped impurity diffusion layer;

depositing a protective film on the word lines and spacings;

depositing a first insulating film on the protective film so that the first and second spacings are filled whereas the third spacing is not filled;

removing the first insulating film to form side walls on side surfaces of the word lines side to expose the protective film between side walls in the third spacing whereas the protective film in the first and second spacings is not exposed; and forming metal silicide film on the top surfaces of the first to fourth word lines.

4. The method of fabricating a semiconductor device according to claim 3, further comprising:

implanting impurity ions, after removing the first insulating film, to form a second doped impurity diffusion layer self-aligned with the side walls, said second doped impurity diffusion layer having higher impurity concentration than that of the first doped impurity diffusion layer;

depositing a second insulating film;

depositing a third insulating film in the third spacing;

removing the second and third insulating films to expose the protective film on the top surfaces of the word lines; and removing the exposed protective film.

5. The method of fabricating a semiconductor device according to claim 3, wherein the protective film and the second insulating film are silicon nitride film and the first and third insulating films are silicon oxide film.

6. The method of fabricating a semiconductor device according to claim 3, wherein the length of the third spacing is not less than two times of the length of first or second spacing.

7. The method of fabricating a semiconductor device, comprising:

forming a first capacitor and a second capacitor constructing memory cells in a memory cell array region of a semiconductor substrate;

forming first, second, third and fourth word lines above the semiconductor substrate, a first spacing between the first word line and the second word line being equal to a second spacing between the third word line and the fourth word line, and the first/second spacing being smaller than a third spacing between the second word line and the third word line; said second word line being used to transfer charges from/to the first capacitor, and said third word line being used to transfer charges from/to the second capacitor, in the memory cell array region;

forming a gate electrodes above the semiconductor substrate in a logic circuit region;

implanting impurity ions in surface areas of the substrate in the first through three spacings to form a first doped impurity diffusion layer in the memory cell region, and in element active regions around the gate electrodes to form a second doped impurity diffusion layer in the logic circuit region;

depositing a protective film on the word lines arid spacings in the memory cell array region, and on the gates and on the element active regions in the logic circuit region;

depositing a first insulating film on the protective film so that the first and second spacings are filled whereas the third spacing is not filled;

removing the first insulating film to form side walls on side surfaces of the word lines and to expose the protective film between side walls in the third spacing whereas the protective film in the first and second spacings is not exposed in the memory cell array region; and to form side walls on side surfaces of the gate electrodes in the logic circuit region;

forming metal silicide film on the top surfaces of the first to fourth word lines in the memory cell array region, and on the top, surface of the gate electrode and surface of the element active regions in the logic circuit region.

8. The method of fabricating a semiconductor device according to claim 7, further comprising:

implanting impurity ions, after removing the first insulating film, to form a third doped impurity diffusion layer self-aligned with the side walls in the memory cell array region, and to form a fourth doped impurity diffusion layer self-aligned with the side walls of the gate electrodes in the logic circuit region, said third end fourth doped impurity diffusion layers having higher impurity concentration than that of the first and second doped impurity diffusion layers;

depositing a second insulating film;

depositing a third insulating film in the third spacing;

removing the second and third insulating films to expose the protective film on the top surfaces of the word lines in the memory cell array region, and to expose the protective film on the top surface of the gate electrode and on the surface of the element active regions; and removing the exposed protective film.

9. The method of fabricating a semiconductor device according to claim 7, wherein the protective film and the second insulating film are silicon nitride film and the first and third insulating films are silicon oxide film.

10. The method of fabricating a semiconductor device according to claim 7, wherein the length of the third spacing is not less than two times of the length of first or second spacing.

* * * * *